US008874397B2

(12) United States Patent
Moran et al.

(10) Patent No.: US 8,874,397 B2
(45) Date of Patent: Oct. 28, 2014

(54) USER-INVOKED CALIBRATION OF MODULAR SYSTEM USING AN EMBEDDED CALIBRATION SIGNAL GENERATOR

(75) Inventors: Tamir E. Moran, Petaluma, CA (US); Jatinderjit S. Bains, Santa Rosa, CA (US); Daniel S. Wertz, Sebastopol, CA (US)

(73) Assignee: National Instruments Corporation, Austin, TX (US)

( * ) Notice: Subject to any disclaimer, the term of this patent is extended or adjusted under 35 U.S.C. 154(b) by 614 days.

(21) Appl. No.: 13/006,631

(22) Filed: Jan. 14, 2011

(65) Prior Publication Data
US 2012/0185199 A1    Jul. 19, 2012

(51) Int. Cl.
*G01D 18/00* (2006.01)
*G01R 35/00* (2006.01)
*G01D 1/02* (2006.01)
*G01R 29/027* (2006.01)
*G01R 19/25* (2006.01)

(52) U.S. Cl.
CPC .......... *G01R 35/005* (2013.01); *G01R 19/2516* (2013.01)
USPC .............. 702/85; 702/106; 702/107; 702/125

(58) Field of Classification Search
CPC .... G06F 19/00; G01R 35/00; G01R 2031/00; G01R 19/2516
USPC .................................. 702/85, 106, 107, 125
See application file for complete search history.

(56) References Cited

U.S. PATENT DOCUMENTS

| | | | |
|---|---|---|---|
| 3,810,130 A * | 5/1974 | Schneider ...................... 365/181 |
| 5,929,628 A * | 7/1999 | Becker et al. ............ 324/750.02 |
| 6,943,627 B2 * | 9/2005 | Leyonhjelm et al. ......... 330/149 |
| 7,024,660 B2 * | 4/2006 | Andrade et al. .............. 717/124 |
| 7,542,738 B2 * | 6/2009 | Posamentier .............. 455/114.3 |
| 7,633,354 B2 * | 12/2009 | Kuijk et al. .................. 333/28 R |
| 8,102,953 B2 * | 1/2012 | Roufoogaran et al. ....... 375/345 |
| 8,112,238 B1 * | 2/2012 | Gorin ............................ 702/107 |

OTHER PUBLICATIONS

NI PXIe-5622 Specifications: 16-Bit IF Digitizer with Onboard Signal Processing, Jul. 2008 National Instruments Corporation, 28 pages.

(Continued)

*Primary Examiner* — Michael Nghiem
*Assistant Examiner* — Alexander Satanovsky
(74) *Attorney, Agent, or Firm* — Meyertons Hood Kivlin Kowert & Goetzel, P.C.; Jeffrey C. Hood; Mark K. Brightwell

(57) ABSTRACT

A user obtains a set of modules, inserts them into slots of a chassis, and interconnects the modules to form a modular instrument. A signal path extends through the modules. To support calibration of the signal path, a first of the modules (or the chassis or a calibration module) includes a calibration signal generator. A computer directs the first module to apply the calibration signal from the generator to the signal path, and measures the power (or amplitude) of the output of the signal path. The computer reads a factory-measured value A of the calibration signal amplitude from a memory of the first module (or the chassis or the calibration module). The value A and the measured output power of the signal path are used to determine a gain of the signal path. The system compensates for that gain when the signal path is used to measure live operational signals.

21 Claims, 13 Drawing Sheets

(56) References Cited

OTHER PUBLICATIONS

NI PXIe-5663 Specifications: 6.6 GHz RF Vector Signal Analyzer with Digital Downconversion, Jul. 2008 National Instruments Corporation, 30 pages.

NI PXIe-5601 Specifications: RF Downconverter, Jul. 2008 National Instruments Corporation, 22 pages.

Vector Signal Analyzer: NI PXIe-5663, NI PXIe-5663E, 2010 National Instruments Corporation, 8 pages.

* cited by examiner

USER-INVOKED CALIBRATION OF MODULAR SYSTEM USING AN EMBEDDED CALIBRATION SIGNAL GENERATOR

FIELD OF THE INVENTION

This invention relates to calibration techniques, and more particularly to systems and methods for determining the gain (at a given frequency or over a range of frequencies) of a measuring instrument that includes a series of one or more computer-controlled modules.

DESCRIPTION OF THE RELATED ART

In the past, modular instruments have been configured using a computer, a chassis and individual modules inserted (or mounted) in the chassis. The modules have been configured to perform any of a variety of functions. The individual modules have often been configured to operate separately. As such, users were free to interchange modules without impacting their specified performance. Each module would typically have been tested, calibrated, and its performance would have been verified in the factory prior to being shipped to the end user. As modular products become more complex, as in the case of RF test equipment, multiple modules may be required to work together to make up a system. An example is the NI PXIe-5663 vector signal analyzer (VSA) shown in FIG. 1. The NI PXIe-5663 VSA includes the following three separate modules: the NI PXIe-5652 RF signal generator (used as an LO source); the NI PXIe-5601 RF downconverter; and the NI PXIe-5622 IF digitizer. (The downconverter module operates on an input signal to produce an intermediate frequency signal using a local oscillator signal provided by the signal generator module. The IF digitizer module serves to digitize the IF signal to produce a stream of IF samples. For more information regarding the PXIe-5663 VSA, please see the data sheet for that system, which can be downloaded from the following link: http://www.ni.com/pdf/products/us/cat_PXIe_5663.pdf. That data sheet is hereby incorporated by reference in its entirety.) A modular instrument provider assembles the system by inserting the modules in a chassis, and interconnecting the modules with RF cables via their front panels. The modular instrument provider then calibrates the system in this assembled configuration using a factory calibration signal generator and factory measurement equipment. The calibration process determines calibration information such as a gain associated with the system in its assembled configuration. The modular instrument provider ships the calibrated system to the customer in the assembled configuration. Because the calibration information depends on the assembled configuration, the customer must maintain the system in the assembled configuration in order to guarantee the system's specified performance according to the data sheet. For example, if the customer replaces one of the interconnecting cables, or replaces a failing module with a new module of the same model, the factory-determined calibration information is no longer valid, and subsequent use of the system in the altered configuration will suffer from degraded performance. This problem essentially defeats the intent of a modular system.

SUMMARY

In some embodiments, the problem mentioned above may be mitigated by providing an internal calibration signal that is well characterized and stable over time and temperature, that can be engaged by a user at any time. This calibration signal may originate in the first module (of a series of modules), i.e., where the signal path begins. The characteristics of the calibration signal such as its power and frequency may be measured precisely in the factory and stored in memory that resides on the module itself. Users are thus free to disassemble and then reassemble the system, swap modules, swap chassis, replace any inter-module connections (e.g., RF coax cables), and still maintain the specified system performance.

Prior to the present invention, a modular instrument supplier was unable to ship this sort of a system as individual modules, but only as an integrated set that included all the modules placed in the chassis and connected together. The user was unable to disconnect the system in any manner without having to ship it back to the factory for recalibration. The present invention may eliminate these complications and/or ensure the true modular nature of modular system.

In some embodiments, a high precision calibration signal may be injected in some manner such as a switch, a splitter/combiner, a coupler, or a bridge into the signal path (e.g., an RF signal path). The calibration signal may also be manually connected to the signal input (e.g., an RF signal input) via any suitable cable. The calibration signal may reside in a module and/or in the chassis that houses the modular instrument.

The calibration signal generator may be implemented with a synthesized source and a temperature-stable power leveling loop. The output power and frequency of the calibration signal are measured in the factory and stored in a memory of some type that resides on the hardware containing the calibration signal generator.

A signal transformation path extends through a series of one or more interconnected electronic modules. The signal transformation path comprises a series of electronic systems that reside within the modules, respectively. An input to the signal transformation path resides in a first module of the series. An output of the signal transformation path resides in a last module of the series. The modules may be purchased (or otherwise obtained) by a user and then interconnected by the user to form the series. The modules may be configured for insertion into respective slots of a chassis. Furthermore, the modules may be configured to operate under the control of a computer.

In one set of embodiments, the gain between the input and output of the signal transformation path may be determined by the following method. The user may invoke this method himself/herself, e.g., by selecting an appropriate command via a graphical user interface (GUI) of the computer.

A computer may send a calibration instruction to the first module. The calibration instruction directs the first module to couple a calibration signal produced by a calibration signal generator to the input of the signal transformation path. The calibration signal generator may be located within the first module. However, in alternative embodiments, the calibration signal generator may be located in the chassis, or, in a separate module dedicated to the function of sourcing a calibration signal. (That separate calibration-signal-sourcing module may itself be configured for insertion in a slot of the chassis.)

The computer may read one or more measurement values from a memory of the first module, where the measurement values include a measured value of the amplitude of the calibration signal, and perhaps also a measured value of the frequency of the calibration signal. The measurement values have preferably been determined by measurements of the calibration signal performed at a facility that manufactures the first module, and been stored into the memory prior to delivery of the first module to the user.

The computer may read output power measurements from a power measuring device, where the output power measurements are measurements of power of an output signal produced at the output of the signal transformation path. Alternatively, the computer may read instantaneous amplitude values (samples) of the output signal, e.g., from the last of the modules, and then compute power values from the instantaneous amplitude values.

The computer may calculate a gain between the input and the output of the signal transformation path based on the measured value of the amplitude of the calibration signal and based on the output power measurements.

The computer may store the gain in a memory of the computer, e.g., for future use in compensating for that gain during measurements of a live operating signal.

Because the calibration signal generator and the measurement values (that characterize the calibration signal) are located within a module of the interconnected series or within the chassis, the above-described gain determination method may be invoked by a user anytime he/she desires to achieve calibration of the signal transformation path. For example, anytime the user replaces one (or more) of the cables that interconnect between modules of the series, the user may wish to invoke the method to recalibrate the signal transformation path. As another example, if one of the modules of the series fails and the user replaces that module with a new unit of the same model, the user may wish to invoke the method.

The above-described method has the advantage that the user may invoke an automatic calibration of the signal transformation path, and thus, avoid the time-consuming and costly process of sending the whole series of modules to the manufacturer for factory calibration.

The calibration signal generator is preferably tunable, i.e., configured so that the nominal frequency (and perhaps also the nominal amplitude) of the calibration signal is programmable over a given frequency range (e.g., an operating frequency range of the input of the signal transformation path). Thus, the above-described procedure for determining the gain of the signal transformation path may be performed repeatedly for a series of nominal frequency values that span the frequency range. Prior to each repetition, the calibration signal generator is re-tuned to the next nominal frequency value, e.g., by an appropriate tuning command sent by the computer. In this manner, the computer may obtain a gain vs. frequency characterization of the signal transformation path.

The gain vs. frequency characterization is stored for future use. For example, when the user intends to make measurements of power on a received signal using the series of modules, the computer may access the stored characterization and use that characterization to compute (e.g., by interpolation) a power correction factor appropriate for the center frequency of the received signal. The power correction factor may be applied to measurements of power of the output signal produced at the output of the signal transformation path in response to coupling the received signal to the input of the signal transformation path. The application of the power correction factor compensates for the power gain of the signal transformation path.

In one embodiment, the frequency range over which the gain-vs-frequency characterization has been obtained is a broad range, e.g., covering frequencies from near DC to multiple GigaHertz.

In another embodiment, the frequency range may be more narrow, e.g., a range covering the bandwidth of a given received signal. In this case, the gain-vs-frequency characterization may be used to determine parameters for a gain equalization filter. The gain equalization filter may be applied to the output signal from the signal transformation path in order to compensate for the gain of the signal transformation path when the received signal is being applied to the input of the signal transformation path. The computer may send the equalization filter (i.e., the parameters defining the equalization filter) to one of the modules of the series, e.g., to the last module of the series. The receiving module may be configured to apply the equalization filter to the output of the signal transformation path in order to compensate for the gain of the signal transformation path as a function of frequency. For example, the receiving module may include a programmable hardware element (such as an FPGA) and/or a processor that is programmed to perform the equalization filtering. In one alternative embodiment, the receiving module may include dedicated circuitry for performing the equalization filtering.

In one set of embodiments, a system according to the present invention may include a plurality of modules, where each of the modules includes a corresponding signal-modifying subsystem. The modules are interconnected so that the corresponding signal-modifying subsystems form a series. The user may interconnect the modules to form the series, e.g., by coupling each module to the next with an appropriate cable or wired connection. Each of the modules is a separate package. The modules may be configured for insertion in a chassis having a plurality of slots. (In some embodiments, the modules are designed to perform their respective functions while being inserted in respective slots of the chassis.)

In addition to the signal-modifying subsystem, the first module of the series may also include an input port, a calibration signal generator, a switching device, memory and control logic.

The input port is configured for receiving an input signal from a source outside the first module.

The calibration signal generator is configured to generate a calibration signal having a stable frequency and amplitude. (The calibration signal generator is preferably configured to generate the calibration signal so that the amplitude and frequency of the calibration signal are stable with respect to time and with respect to changes in temperature.) The measured values have preferably been determined by measuring the calibration signal at a facility that manufactures the first module, and been stored into the memory at that facility prior to delivery of the first module to the user.

The switching device is configured to selectively supply either the input signal or the calibration signal as a selected signal to an input of the signal-modifying subsystem in the first module, where the switching device selectively passes either the input signal or the calibration signal based on a selection input. The memory stores measured values associated with the calibration signal, where the measured values include a measured value of the amplitude of the calibration signal, and perhaps also a measured value of the frequency of the calibration signal.

The control logic is configured to access the memory and to make the measured values available to a computer external to the system in response to a request received from the computer.

In one embodiment, the signal-modifying subsystem of the first module includes a frequency-down conversion circuit (or more generally, a frequency translation circuit); and the signal-modifying subsystem of the last module of the series includes an analog-to-digital converter (and perhaps also a processor and/or an FPGA).

In one set of embodiments, an electronic module may include an input port, a calibration signal generator, a switching device, functional circuitry, an output port, memory, and control logic. The module may be constructed as a single package.

The input port may be configured for receiving an input signal from a source external to the module.

The calibration signal generator may be configured to generate a calibration signal so that an amplitude and frequency of the calibration signal are stable with respect to time and with respect to changes in temperature.

The switching device may be configured to selectively pass either the input signal or the calibration signal as a selected signal to an internal signal path within the electronic module. The switching device selectively passes either the input signal or the calibration signal based on a selection control input.

The functional circuitry may be configured to receive the selected signal from the internal signal path and operate on the selected signal in order to generate an output signal. The output port may be configured for outputting the output signal from the module.

The memory stores measured values associated with the calibration signal. The measured values include a measured value of the amplitude of the calibration signal, and perhaps also a measured value of the amplitude of the calibration signal. The measured values have preferably been determined by measurement of the calibration signal at a facility that manufactures the module, and been stored into the memory prior to delivery of the module to the end user.

The control logic may be configured to access the memory and to provide the measured values to a computer external to the module in response to a request received from the computer.

In some embodiments, the functional circuitry includes frequency down-conversion circuitry; and the output signal of the functional circuitry is a frequency down-converted version of the selected signal. The input signal may be a modulated carrier signal.

In one set of embodiments, a chassis for housing a plurality of electrical modules may include a communication bus, a plurality of slots, a calibration signal generator, memory and control logic.

The plurality of slots may be configured to admit insertion of the electrical modules, respectively. Each of the slots may be configured to couple a corresponding one (or more) of the electrical modules to the communication bus when that electrical module is inserted in the slot.

The calibration signal generator may be configured to generate a calibration signal having a stable amplitude and frequency. At least one of the plurality of slots may be configured to provide the calibration signal to a first of the electrical modules when that first electrical module is inserted into the slot. For example, in one embodiment, each of the plurality of slots is so configured.

The memory stores a set of one or more measured values associated with the calibration signal. The measured values include a measured value of the amplitude of the calibration signal, and perhaps also a measured value of the frequency of the calibration signal. The measured values have preferably been determined by measuring the calibration signal at a facility that manufactures the chassis, and been stored into the memory prior to delivery of the chassis to the user.

The control logic may be configured to access the memory and to provide the measured values to a computer in response to a request received from the computer, e.g., via the communication bus.

The chassis may also include a timing bus, a power supply, a reference clock, or any combination thereof.

In some embodiments, the chassis may also include an output port coupled to the calibration signal generator, where the output port is configured to output the calibration signal from the chassis. The output port may have a connector that is configured to mate with an end connector of an external cable. The connector may be mounted, e.g., on a front panel of the chassis.

In one set of embodiments, an electronic module may include a calibration signal generator, memory, control logic and a calibration output port. The module is constructed as a single package.

The calibration signal generator may be configured to generate a calibration signal so that an amplitude and frequency of the calibration signal are stable with respect to time and with respect to changes in temperature.

The memory stores a set of one or more measured values associated with the calibration signal. The measured values include a measured value of the amplitude of the calibration signal, and perhaps also a measured value of the frequency of the calibration signal. The measured values have preferably been determined by measuring the calibration signal at a facility that manufactures the system, and been stored into the memory prior to delivery of the electronic module to the user.

The control logic may be configured to access the memory and to provide the measured values to a computer external to the electronic module in response to a request received from the computer.

The calibration output port may be coupled to the calibration signal generator, and configured to output the calibration signal from the electronic module.

Any of the various modules or chassis described herein may be implemented in a manner that conforms to one or more existing standards, e.g., any one or more of the following standards: VME, VXI, PCI, PCI Express, PXI, PXI Express, GPIB, AXIe, etc.

A computer-readable memory medium is a memory medium that stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computer system may be configured to include a processor (or a set of processors) and a memory medium. The memory medium stores program instructions. The processor is configured to read and execute the program instructions from the memory medium. The program instructions, if executed by the processor, cause the processor to perform a method, e.g., any of the method embodiments described herein, or, any combination of the method embodiments described herein, or, any subset of any of the method embodiments described herein, or, any combination of such subsets. The computer system may be realized in any of various forms. For example, the computer system may be a personal computer (in any of its various realizations), a desktop computer, a workstation, a computer on a card, a computer in a modular package, a server computer, a client computer, a laptop computer, a hand-held device, a mobile device, a tablet computer, a wearable computer, an Internet appliance, etc.

In some embodiments, a set of computers distributed across a network may be configured to partition the effort of executing a computational method (e.g., any of the method embodiments disclosed herein).

BRIEF DESCRIPTION OF THE DRAWINGS

A better understanding of the present invention can be obtained when the following detailed description of the preferred embodiment is considered in conjunction with the following drawings, in which.

Figure 1:
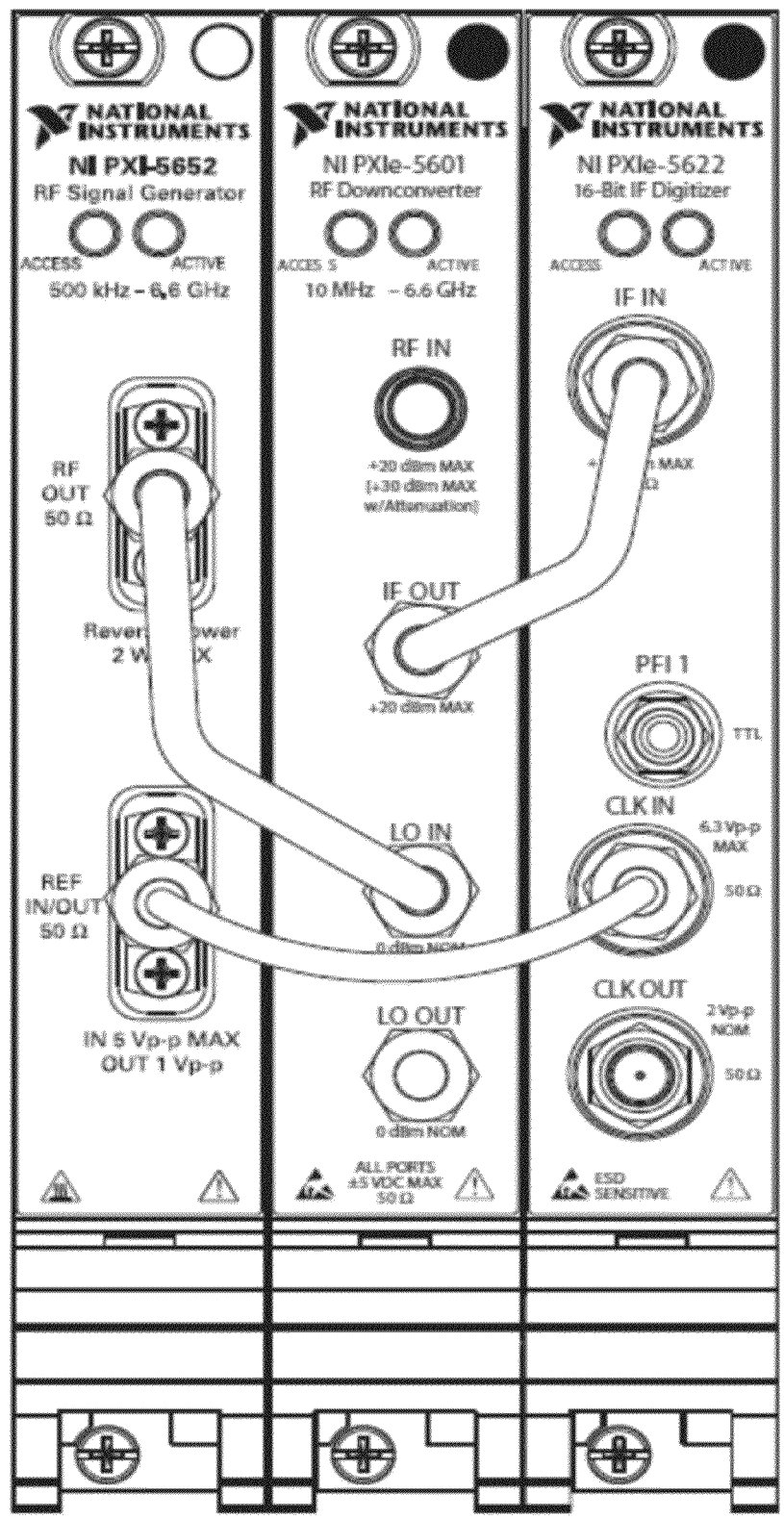
FIG. 1 illustrates a prior art modular instrument including three modules, each configured for insertion in a chassis.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE PREFERRED EMBODIMENTS

A user obtains one or more modules, and interconnects the ones or more modules to form a series. Each module includes a corresponding electronic system. The connection (e.g., cable connection) between each module $M_j$ and the next module $M_{j+1}$ (in the series of modules) serves to connect the output of the electronic system $S_j$ in module $M_j$ to the input of the electronic system $S_{j+1}$ in module $M_{j+1}$. Thus, the one or more electronic systems also form a series by virtue of the one or more modules being connected together.

The electronic system of each module is configured to perform a corresponding signal transformation operation (e.g., signal processing operation). Thus, the series of one or more electronic systems define a series of signal transformations. The series of one or more electronic systems is referred to herein as a signal transformation path. An input to the signal transformation path resides in the first module of the series. (The input to the electronic system of the first module may be interpreted as the input to the signal transformation path.) An output of the signal transformation path resides in the last module of the series. (The output of the electronic system of the last module may be interpreted as the output of the signal transformation path.)

In some embodiments, the input to the signal transformation path is an analog input, and the output to the signal transformation path is a discrete-time output comprising a sequence of samples. (Thus, the last module or some module previous to the last module includes an analog-to-digital converter.) In an alternative embodiment, the output to the signal transformation path may be an analog signal output.

A user may purchase (or otherwise obtain) the modules separately and then interconnect the modules to the form the series, e.g., by coupling the modules with interconnecting cables. The modules may be of different kinds, e.g., specialized for different functions. Alternatively, the modules may be homogeneous in terms of circuit structure, but may be programmed to achieve appropriate functions for operating as part of a user-desired flow of processing.

Each of the modules may be configured to operate under the control of a computer. The computer itself operates under the control of program instructions stored in memory (e.g., RAM and/or ROM of the computer). The computer is configured to communicate with the modules through a communication bus, or, a system of interconnected buses. The computer may be realized by any of a wide variety of computer types. For example, in some embodiments, the computer may be a desktop computer, a server computer, a client computer, a laptop computer, a mobile device, a hand-held device, a tablet computer, etc.

The modules may be configured for insertion in the slots of a chassis. A backplane of the chassis provides a communication bus through which the computer may communicate with each of the modules. (In one embodiment, the computer may be configured for insertion in a controller slot of the chassis.) The backplane may provide power to the modules when those modules are inserted in respective slots of the chassis.

Figure 2A:
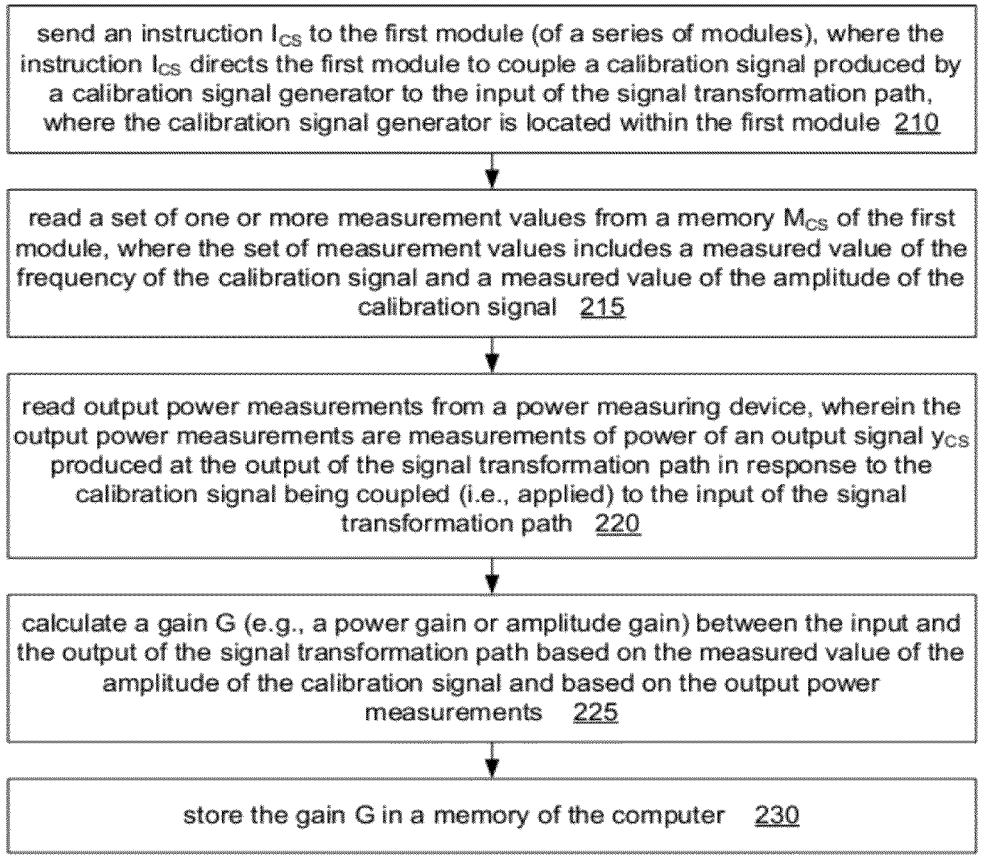
FIG. 2A is flowchart illustrating one embodiment of a method for calibrating a signal transformation path.

In some embodiments, a method for operating the computer in order to calibrate the signal transformation path may involve the operations shown in FIG. 2A.

At 210, the computer may send an instruction $I_{CS}$ to the first module of the series, where the instruction $I_{CS}$ directs the first module to couple a calibration signal produced by a calibration signal generator to the input of the signal transformation path. (The action of coupling the calibration signal to the input of the signal transformation path may involve decoupling any other signal that happens to be coupled to that input at the time the instruction is sent. See the embodiments of the first module described below.) The calibration signal generator is located within the first module. The computer may send the instruction $I_{CS}$ to the first module through the communication bus (or system of interconnected buses). In some embodiments, the communication bus may be a PCI bus, a PCI Express bus, a PXI bus, a PXI Express bus, a USB bus, a firewire bus, an Ethernet bus, a GPIB bus, AXIe, or any combination thereof.

The instruction $I_{CS}$ sent by the computer may include the specification (or identification or selection) of a nominal frequency that the calibration signal generator is supposed to achieve, i.e., that the calibration signal is supposed to have.

For example, the user may specify the nominal frequency via the graphical user interface of a program running on the computer.

At 215, the computer may read a set of one or more measurement values from a memory $M_{CS}$ of the first module. The set of measurement values may include a measured value of the amplitude of the calibration signal. The set of measurement values may also include a measured value of the frequency of the calibration signal. The memory $M_{CS}$ is non-volatile memory so that the measurement values are maintained even though the first module may be powered off for long periods of time, e.g., for a number of months or years, e.g., for a time longer than the mean operational lifetime of the calibration signal generator or the mean operational lifetime of the first module.

In some embodiments, it is assumed that the measurement values that are resident in the memory $M_{CS}$ have been determined (i.e., previously determined) by measurements of the calibration signal performed at a facility that manufactures the first module. The manufacturer has employed high-precision measurement equipment to measure the amplitude and frequency of the calibration signal produced by the calibration signal generator. The manufacturer has stored the measured values into the memory $M_{CS}$ of the first module prior to delivering the first module to a user.

In one embodiment, the manufacturer may perform the measurements on the calibration signal generator after the first module has been assembled. The first module may have a calibration signal port configured to output the calibration signal. Thus, the measurement of the amplitude and frequency of the calibration signal may be obtained by coupling the measurement equipment to the calibration signal port. In another embodiment, the manufacturer may perform the measurements on an electronic card/board that includes the calibration signal generator, and prior to incorporation of that card/board into a final package.

At 220, the computer may read output power measurements from a power measuring device, wherein the output power measurements are measurements of power of an output signal $y_{CS}$ produced at the output of the signal transformation path. The output signal $y_{CS}$ is produced at the output of the signal transformation path in response to the calibration signal being coupled (i.e., applied) to the input of the signal transformation path.

As noted above, the output of the signal transformation path resides in the last module. The power measuring device may also reside in the last module, or alternatively, reside external to the last module. In the former case, the computer may read the output power measurements from the last module, e.g., via the communication bus (or the system of interconnected busses).

At 225, the computer may calculate a gain G (e.g., a power gain or amplitude gain) between the input and the output of the signal transformation path based on the measured value $A_{CS}$ of the amplitude of the calibration signal and based on the output power measurements. For example, in one embodiment, the computer may average the output power measurements to determine an average power value $P_{AVG}$, and then calculate the gain based on the average power value $P_{AVG}$ and the measured amplitude value $A_{CS}$ of the calibration signal.

At 230, the computer may store the gain G in a memory of the computer, e.g., in the RAM of the computer system. Additionally or alternatively, the computer may store the gain G in a memory of the last module of the series.

In some embodiments, the computer performs operations 210 through 230 in response to receiving a user command through a graphical user interface. For example, the graphical user interface may provide the user with a button (or other GUI element) that may be clicked (or otherwise selected) to invoke calibration of the signal transformation path.

In some embodiments, the computer may send an instruction $I_{EXT}$ to the first module, where the instruction $I_{EXT}$ directs the first module to couple an external signal $x_{EXT}$ to the input of the signal transformation path. The external signal is from a source external to the first module. (The computer may send the instruction $I_{EXT}$ after having calculated the gain.) (The action of coupling the external signal to the input of the signal transformation path may include decoupling the calibration signal from the input of the signal transformation path.)

After having sent the instruction $I_{EXT}$, the computer may read additional output power measurements from the power measuring device, where the additional output power measurements are measurements of power of the output signal $y_{EXT}$ produced at the output of the signal transformation path in response to the action of coupling the external signal $x_{EXT}$ to the input of the signal transformation path. (In the case where the output signal $y_{EXT}$ is a discrete-time signal comprising a sequence of samples, the additional output power measurements may be determined by operating on each sample of the sample sequence.) (In one embodiment, the power measuring device is realized by a processor running under program control, or, a programmable hardware element such as an FPGA.) Furthermore, the computer may calculate the power $P(x_{EXT})$ of the external signal $x_{EXT}$ based on the gain G stored in the memory of the computer and based on the additional output power measurements read (i.e., obtained) from the power measuring device. For example, the computer may average the additional output power measurements to obtain an average power $P_{AVG}(y_{EXT})$ of the output signal $y_{EXT}$, and then calculate the power $P(x_{EXT})$ of the external signal $x_{EXT}$ based on the average power $P_{AVG}(y_{EXT})$ and the gain G.

In some embodiments, the memory $M_{CS}$ of the first module (or perhaps the memory of the last module) may store a set $S_G$ of factory-measured gain values corresponding to a set $S_F$ of frequencies that span a frequency range. Each of the factory-measured gain values is a gain of the signal transformation path at the corresponding frequency. Furthermore, the frequency of the calibration signal produced by the calibration signal generator (see operation 210 above) is within the frequency range. In this situation, the computer may: compute a gain value G corresponding to the frequency of the calibration signal based on the factory-measured gain values; applying a translation to the set of factory-measured gain values based on a difference between the gain G (calculated in operation 225 above) and the gain value G*; and store the translated set of gain values in the memory of the first module for later use in correcting power measurements on received signals (e.g., live operational signals) at frequencies within the frequency range. This process of obtaining a translated set of gain values may be invoked, e.g., when the user replaces one of the interconnecting cables in the system or makes some other change to the system that is likely to affect the gain of the signal transformation path.

The action of computing the gain value G* corresponding to the frequency of the calibration signal may involve interpolating two or more of the factory-measured gain values corresponding to frequencies near the frequency of the calibration signal.

The action of applying a translation to the set of factory-measured gain values involves adding the difference value G−G* to each of the factory-measured gain values. Thus, a graph of the gain values versus frequency would exhibit a vertical translation.

The factory-measured gain values, as the terminology suggests, are determined by measurements made in the factory prior to shipping the first module (or the whatever module that is selected to store those gain values) to the user. The measurements are made by assembling the series of modules (e.g., by inserting them into a chassis and interconnecting the modules with cables) and then executing the operations 215 through 230 for each of the frequencies of the set $S_F$. The gain values thus obtained comprise the set $S_G$ of factory-measured gain values. The gain values $S_G$ are stored into the memory of the first module (or the last module) prior to shipping the first module (or the last module) to the user.

The calibration signal generator is preferably configured so that a nominal frequency of the calibration signal is programmable. Thus, the method of FIG. 2A may also involve the computer determining values $G(f_k)$ of the gain G corresponding respectively to distinct values $f_k$ of the nominal frequency by repeatedly programming the nominal frequency of the calibration signal to each of the distinct values $f_k$ and performing operations 215 through 230 for each of the distinct values $f_k$.

Figure 2B:
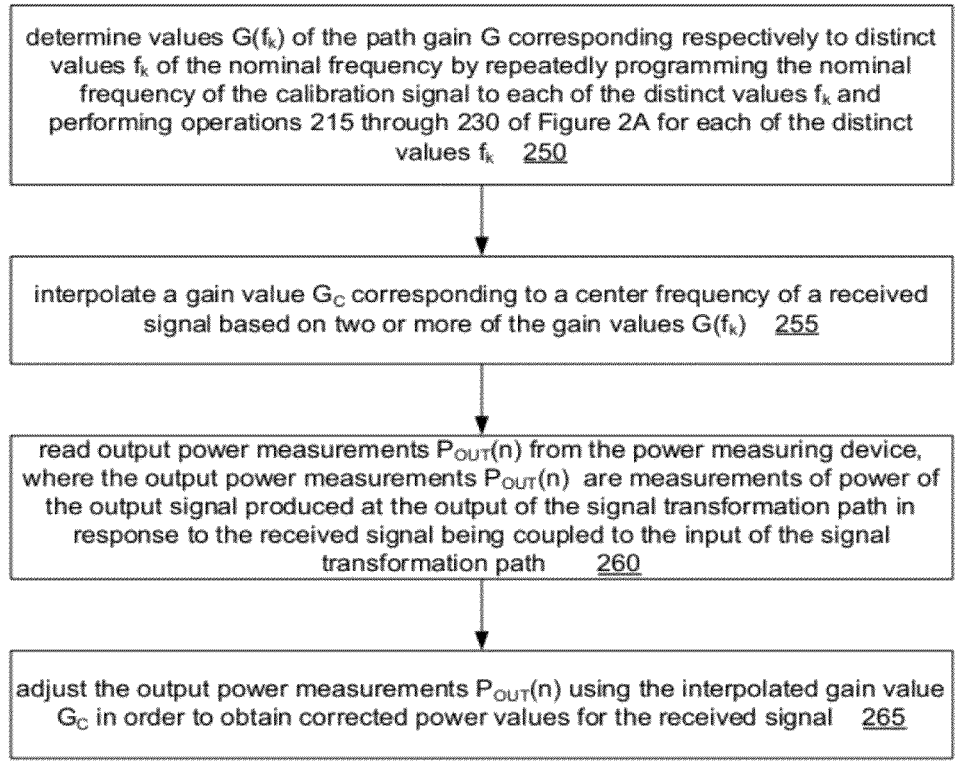
FIG. 2B illustrates one embodiment of a method for compensating power measurements obtained from the output of a signal transformation path, where the compensation factor is computed based on gain values $G(f_k)$ obtained by repeated applications of the method of FIG. 2A at distinct frequencies $f_k$.

In some embodiments, the computer may use one or more of the gain values $G(f_k)$ to adjust (correct) power measurements of a received signal. For example, in the embodiment of FIG. 2B, the computer may interpolate a gain value $G_C$ corresponding to a center frequency of the received signal based on two or more of the gain values $G(f_k)$, e.g., two or more of the gain values $G(f_k)$ corresponding to frequencies $f_k$ near the center frequency. (See operation 255.) The computer may instruct the first module to decouple the calibration signal from the input of the signal transformation path and couple the received signal to the input of the signal transformation path, and then read output power measurements $P_{OUT}(n)$ from the power measuring device. (See operation 260.) The output power measurements $P_{OUT}(n)$ are measurements of power of the output signal produced at the output of the signal transformation path in response to the received signal being coupled to the input of the signal transformation path. The computer adjusts the output power measurements $P_{OUT}(n)$ using the interpolated gain value $G_C$ in order to obtain corrected power values for the received signal as indicated at 265. The adjustment may involve subtracting the decibel equivalent of the gain value $G_C$ from the decibel equivalent of each of the output power measurements $P_{OUT}(n)$.

In some embodiments, the distinct frequencies $f_k$ at which the gain values $G(f_k)$ are determined may be selected to cover the bandwidth of a received signal (i.e., a received signal the user intends to analyze/measure). In these embodiments, the computer may compute an equalization filter for the received signal based on the stored gain values $G(f_k)$. The equalization filter is configured to compensate for the gain of the signal transformation path over the bandwidth of the received signal. The computer may instruct the first module to decouple the calibration signal from the input of the signal transformation path and couple the received signal to the input of the signal transformation path in order to facilitate measurement of the received/analysis of the received signal.

In one embodiment, the computer may send the equalization filter to the last module of series of modules. The last module may be configured to apply the equalization filter to the output signal produced at the output of the signal transformation path in response to said coupling of the received signal to the input of the signal transformation path. For example, the last module may include a programmable processor and/or programmable hardware element to implement the equalization filter.

In some embodiments, one or more of the gain values $G(f_k)$ may be used to adjust a set of factory-measured gain values $G_F(f_j)$ corresponding to a set of frequencies $f_j$ that span a frequency range, provided that the distinct frequencies $f_k$ at which the gain values $G(f_k)$ are obtained are within the frequency range or bound the frequency range. As described above the factory-measured gain values $G_F(f_j)$ are determined by measurements performed at a factory. The factory-measured gain values are stored into the memory $M_{CS}$ of the first module (or a memory of the last module or a memory of the chassis) prior to the shipping the first module (or last module or chassis) to the user. Each of the factory-measured gain values $G_F(f_j)$ is a gain of the signal transformation path at the corresponding frequency $f_j$. In response to a user command, the computer may adjust the set of factory-measured gain values $G_F(f_j)$ as follows. The computer may derive gain values $g_k$ corresponding to the distinct frequencies $f_k$ based on the factory-measured gain values, e.g., by interpolating subsets of the factory-measured gain values to the frequencies $f_k$. The computer may adjust the set of factory-measured gain values based on differences between the gain values $G(f_k)$ and the corresponding gain values $g_k$. The adjusted set of gain values may be stored in memory (e.g., a memory of the computer) for later use in correcting power measurements of received signals. As described above, the user may want to invoke this gain adjustment method after having made a change to the system comprising the series of modules.

As described above, the calibration signal generator may be configured so that a nominal frequency of the calibration signal is programmable. In that case, the computer may send a tuning command to the first module, e.g., prior to the action of sending the instruction $I_{CS}$ to the first module. The tuning command directs the calibration signal generator in the first module to produce the calibration signal with a specified value of the nominal frequency. The specified value may be specified by the tuning command.

As described above, the computer may determine values $G(f_k)$ of the gain corresponding respectively to distinct values $f_k$ of the nominal frequency, where the distinct values of the nominal frequency span a frequency range (e.g., a user-specified frequency range). In some embodiments, the action of determining the gain values corresponding to the distinct values of the nominal frequency may include performing a plurality of iterations of a set of operations, where each iteration corresponds to a respective one of the distinct values of the nominal frequency. The set of operations may include: sending the tuning command for a current value of the nominal frequency; and performing at least operations 215 through 230. (In other words, the action of determining the gain values corresponding to the distinct values of the nominal frequency may include repeatedly performing operations 215 through 230 provided that the calibration signal generator is commanded to retune to the next value of the nominal frequency prior to each repetition.) Each iteration of the set of operations produces a corresponding one of the gain values $G(f_k)$.

The measurement values stored in the memory $M_{CS}$ may include a measured value of the amplitude of the calibration signal (and perhaps also a measured value of the frequency of the calibration signal) for each of the distinct values of the nominal frequency. Each iteration of the above-described set of operations includes performing operation 215, wherein the computer reads the measured amplitude value (and perhaps also the measured frequency value) corresponding to the nominal frequency value for that iteration.

As described above, after having determined the gain values $G(f_k)$ corresponding to the distinct values of the nominal frequency, the computer may compute an equalization filter based on the gain values $G(f_k)$. The equalization filter may comprise a set of time-domain coefficients (e.g., coefficients of an FIR or IIR filter), or alternatively, a spectrum (i.e., a function of frequency). The equalization filter is configured to compensate for the gain of the signal transformation path as a function of frequency.

In some embodiments, the computer may send the equalization filter to the last module of the series. The last module may be configured to apply the equalization filter to the output signal produced at the output of the signal transformation path, e.g., when the series of modules is being used to measure live operational signals.

In some embodiments, the computer may send an instruction $I_{EXT}$ to the first module, where the instruction $I_{EXT}$ directs the first module to couple an external signal to the input of the signal transformation path. (The action of coupling the external signal to the input of the signal transformation path may include decoupling the calibration signal from the input of the signal transformation path if the calibration signal is coupled to that input at the time the computer sends the instruction $I_{EXT}$.) The external signal is supplied by a source external to the first module. (For example, the external signal may be a live operational signal that the user is interested in observing.) The last module may be configured to apply the equalization filter to the output signal produced at the output of the signal transformation path in response to the action of coupling the external signal to the input of the signal transformation path.

The action of applying the equalization filter to the output signal of the signal transformation path may be performed by a processing resource available in the last module, e.g., a program-controlled processor (such as a general-purpose microprocessor or a DSP), a programmable hardware element (such as an FPGA), custom designed circuitry, or any combination thereof.

As noted above, the output signal of the signal transformation path may be a discrete-time signal comprising a sequence of samples. (In this case, the last module or some earlier module in the series of modules may include an analog-to-digital converter.) Thus, the action of applying the equalization filter may involve applying the equalization filter to the sample sequence.

The last module may apply the equalization filter in the time domain (e.g., by convolving the output signal with the impulse response of the equalization filter), or, in the frequency domain (e.g., by multiplying a discrete Fourier transform of the output signal by the spectrum of the equalization filter).

In some embodiments, a processing agent (e.g., an agent not necessarily in the last module) may apply the equalization filter to the output signal, i.e., the output signal produced at the output of the signal transformation path in response to the action of coupling the external signal to the input of the signal transformation path. In one embodiment, the processing agent may be the computer (e.g., the user's computer). Thus, the computer may read the samples of the output signal from the last module, and apply the equalization filter to the samples to obtain the compensated samples.

In some embodiments, the series of one or more interconnected modules includes two modules, where the signal transformation path includes a frequency down-conversion system and a digitizer system. The frequency down-conversion system may be situated in the first module, and the digitizer system may be situated in the last module (i.e., the second module). The frequency down-conversion system is configured to down-convert an input signal present at the input of the signal transformation path in order to obtain an intermediate frequency (IF) signal. The digitizer system is configured to capture samples of the IF signal. The last module may also include processing resources such as a microprocessor and/or a programmable hardware element (such as an FPGA). The computer (e.g., the user's computer) may send programs, e.g., user-defined programs, to the last module so that they may be executed by the microprocessor. The computer may also send configuration information to the last module so that it may be used to configure the programmable hardware element to implement user-specified functionality.

In some embodiments, the computer may incorporate phase information into the equalization filter, e.g., phase information obtained from a separate time-delay calibration procedure. Thus, the equalization filter may be configured to compensate for the complete transfer function (including gain and phase) of the signal transformation path over a specified frequency range. The last module (or some other processing agent) may be configured to apply the equalization filter to output of the signal transformation path in order to obtain a compensated signal. For more information on the time-delay calibration procedure, please refer to U.S. Patent Application No. 61/369,500, filed on Jul. 30, 2010, entitled "Calibration System and Method", invented by Wertz, Corley and Patel, which is hereby incorporated by reference in its entirety.

In some embodiments, the calibration signal generator may be configured to generate two calibration signals having independent (e.g., independently programmable) frequencies. A user-specified superposition or linear combination of the two calibration signals may be supplied to the input of the signal transformation path in response to an instruction (or set of instructions) sent by the computer.

In some embodiments, the computer may instruct the calibration signal generator to produce a calibration signal with a first frequency for a first period of time, and then instruct to the calibration signal generator to retune to a different frequency (i.e., generate the calibration signal with a different frequency) for a second period of time.

Figure 3A:
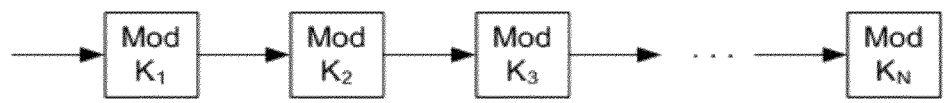
FIG. 3A illustrates one embodiment of a system that includes a series of one or more modules, where the system is configured to facilitate user-invoked calibration of a signal transformation path that extends through the series of one or more modules.

In one set of embodiments, a system according to the present invention may be configured as shown in the conceptual diagram of FIG. 3A. The system includes a plurality of modules $\{K_j\}$. (Alternatively, in some embodiments, the system includes only one module.) Each of the modules includes a corresponding signal-modifying subsystem. (The signal-modifying subsystems may be identified with the electronic systems of the discussion above.) The modules are interconnected so that the corresponding signal-modifying subsystems form a series, i.e., a signal transformation path as described above. The interconnections between the modules may be realized by wired connections (e.g., electrical cables).

Figure 3B:
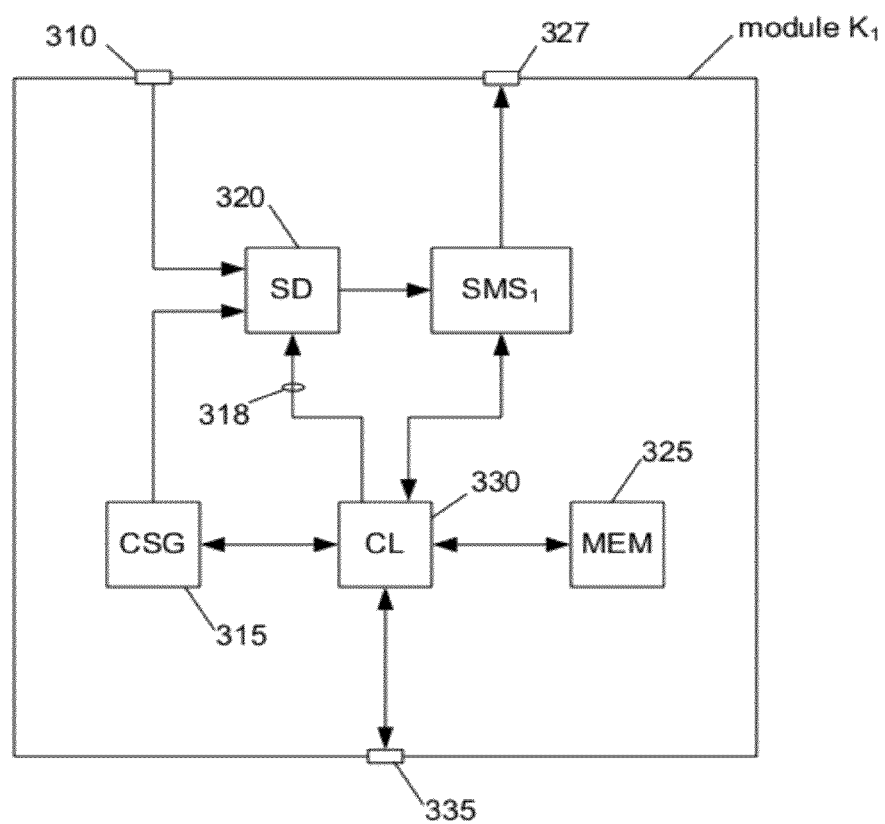
FIG. 3B illustrates one embodiment of the first module of the series of modules shown in FIG. 3A.

As shown in the FIG. 3B, the first module $K_1$ of the series of module also includes: an input port 310, a calibration signal generator 315, a switching device 320, memory 325 and control logic 330.

The input port 310 is configured for receiving an input signal from a source external to the first module.

The calibration signal generator 315 is configured to generate a calibration signal having a stable frequency and stable amplitude. In some embodiments, the calibration signal generator may include a tunable synthesized-tone generator and an automatic level control loop.

The switching device 320 is configured to selectively supply either the input signal or the calibration signal as a selected signal to an input of the signal-modifying subsystem $SMS_1$ in the first module $K_1$. The switching device selectively passes either the input signal or the calibration signal based on a selection input 318. The signal-modifying subsystem $SMS_1$ operates on the selected signal to generate an output signal which is provided to output port 327. The output port 327 may be coupled to an input of the next module $M_2$ of the series, e.g., via a cable connection.

Memory 325 stores a set of one or more measured values associated with the calibration signal. The measured value set may include a measured value of the amplitude of the calibration signal. In some embodiments, the measured value set may also include a measured value of the frequency of the calibration signal. Memory 325 is non-volatile memory. In some embodiments, the one or more measured values have been determined by measuring the calibration signal at a facility that manufactures the first module, and have been stored into the memory 325 at that facility. (See, e.g., the discussion above regarding the manufacturer's measurement.)

Control logic 330 is configured to access the memory and to make the measured values available to a computer external to the system in response to a request received from the computer. (As variously described above, the computer may use the measured values to compute a gain of the series of signal-modifying subsystems.)

The first module $K_1$ may include a communication port 335 configured for coupling to an external communication bus (e.g., a communication bus in the backplane of a chassis in which the first module is inserted). The computer may communicate with the control logic 330 through the communication bus and the communication port 335.

Each of the modules is a separate package.

The modules may be configured for insertion into a chassis having a plurality of slots (e.g., a chassis as described above). Each module is configured for insertion into at least one slot of the chassis. In preferred embodiments, each module may be inserted in any of a plurality of the slots. In one embodiment, the chassis may be a chassis manufactured by National Instruments Corp., e.g., one of the following chassis: PXIe-1075, PXIe-1082, PXIe-1065 and PXIe-1062Q.

In some embodiments, each of the modules is configured to communicate with the computer via a backplane of the chassis.

In some embodiments, the modules (e.g., the front panels of the modules) are interconnected via one or more electrical cables. In addition, the modules may be interconnected via a backplane of a chassis in which the modules are inserted.

In some embodiments, the signal-modifying circuit of the last module includes an analog-to-digital converter. Thus, the output signal produced by that signal-modifying circuit may be a stream of samples. In one embodiment, the last module includes control logic configured to transfer the samples to the computer in response to a read request received from the computer. Thus, as an alternative to sending power measurements to the computer (as described above), the last module may send the samples of the output signal, and the computer may compute the power values from the samples.

In some embodiments, the control logic may be realized in terms of a program that executes on a processor of the last module. However, other realizations are contemplated. For example, the control logic may be realized in terms of custom-designed digital circuitry and/or in terms of an appropriately-configured programmable hardware elements (such as an FPGA).

In some embodiments, the signal-modifying subsystem of the first module $K_1$ includes a frequency-down conversion circuit; and the signal-modifying subsystem of a last of the modules includes at least an analog-to-digital converter. (In one embodiment, the series of modules includes two modules. Thus, the second module $K_2$ is the last module.) The last module may also include a programmable hardware element (such as an FPGA) and/or a processor (such as a general-purpose microprocessor or a DSP).

In some embodiments, the last module may also include an analog output port configured to provide an analog output signal, e.g., an analog signal produced in the signal transformation path just prior to digitization. The analog output port may be useful for the user who has his/her own digitizer and wishes to use that digitizer to sample the analog output signal. The analog output port may also be useful for the user who has his/her own analog signal measuring device (such as a spectrum analyzer), and wishes to use that measuring device to measure the analog output signal.

In some embodiments, the last module $K_N$ of the series of modules includes control logic $CL_N$ and a power measuring device. (N denotes the number of modules in the series.) The power measuring device is configured to make measurements of power of an output signal produced by the signal-modifying circuit of the last module. The power measuring device may be configured to store the power measurements in a memory $M_N$ of the last module $K_N$. The control logic $CL_N$ is configured to transfer the stored power measurements to the computer in response to a read request asserted by the computer. (In some embodiments, the control logic $CL_N$ and the power measuring device may be realized as programs that execute on a processor of the last module. However, other realizations are contemplated. For example, the control logic $CL_N$ and/or the power measuring device may be realized in terms of custom-designed digital circuitry and/or in terms of an appropriately-configured programmable hardware element such as an FPGA).

In some embodiments, the last module $K_N$ may include an output port configured to make an output signal produced by the signal-modifying circuit of the last module available to a device that is external to the last module. For example, in one embodiment, the output signal represents an intermediate frequency (IF) signal. Thus, the output port allows the IF signal to be supplied to a device for further processing, e.g., for the extraction of baseband channels and demodulation/decode of those baseband channels. The device may be configured to operate under the control of the computer. (In one embodiment, the device may be configured for insertion in a slot of the chassis. Thus, the computer may control the device through the backplane of the chassis, or through some other means.)

In some embodiments, the calibration signal generator 315 is configured to generate the calibration signal so that the frequency and the amplitude of the calibration signal are stable with respect to time and with respect to changes in temperature.

Figure 3C:
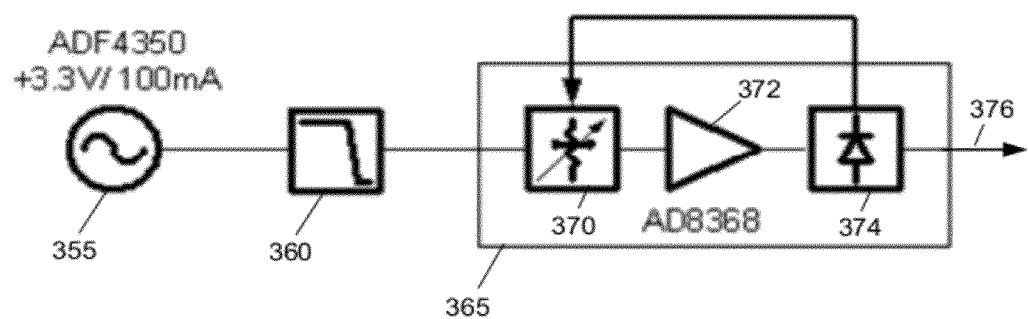
FIG. 3C illustrates one embodiment of a calibration signal generator.

In some embodiments, the calibration signal generator 315 includes a tone synthesizer 355, a low pass filter 360 and a variable gain amplifier 365 as shown in FIG. 3C. The tone synthesizer 355 generates a tone which is supplied to the low pass filter 360. (The tone synthesizer 355 may be, e.g., an ADF4350 wideband synthesizer manufactured by Analog Devices.) The low pass filter may be designed to pass the tone but remove any of its harmonics. The variable gain amplifier 365 may be configured to operate as a power-leveling loop. (The variable gain amplifier 365 may be, e.g., the AD8368 manufactured by Analog Devices.) The power-leveling loop ensures that the amplitude of the calibration signal produced at the output node 376 is stable (e.g., stays relatively constant), even in the presence of variations in temperature.

In one embodiment, the variable gain amplifier may include a variable attenuator 370, an amplifier 372 and a power detector 374. These elements may be coupled with feedback in order to implement the power-leveling loop.

As described above, the measurement values stored in the memory 325 result from measurements made by the manufacturer prior to shipping the first module $M_1$ to the user. In some embodiments, the measurement values include a temperature characterization of the calibration signal generator. The manufacturer may obtain the temperature characterization by measuring the amplitude (and perhaps also the frequency) of the calibration signal at one or more temperatures within the operating temperature range of the first module $M_1$. (The manufacturer may use a temperature chamber whose temperature is accurately controllable to achieve these measurements.)

In some embodiments, the temperature characterization may be used during the calibration method of FIG. 2A in order to obtain a more accurate estimate of the actual amplitude of the calibration signal. For example, the computer (i.e., the computer that performs the calibration method) may calculate an estimate for the actual amplitude of the calibration signal based on the temperature characterization and based on a current temperature of the first module $M_1$. The gain of the signal transformation path may then be computed based on this estimate of the actual amplitude and the above-described power measurements at the output of the signal transformation path. The first module $M_1$ may include a temperature measurement device that is situated so as to report a temperature of the calibration signal generator, or a temperature of the board on which the calibration signal generator resides. The computer may read the current temperature from the first module $M_1$, e.g., as part of the process of reading the measurement values from memory 325.

In some embodiments, the manufacturer may compute an amplitude-versus-temperature coefficient from the measured amplitude values (of the calibration signal) obtain during the temperature characterization procedure. The amplitude-versus-temperature coefficient may be stored in the memory 325 as part of the set of measurement values. Thus, when the user invokes the calibration method of FIG. 2A, the computer may compute the actual amplitude of the calibration signal based on the temperature coefficient and on a difference between the current temperature and a reference temperature.

Figure 4:
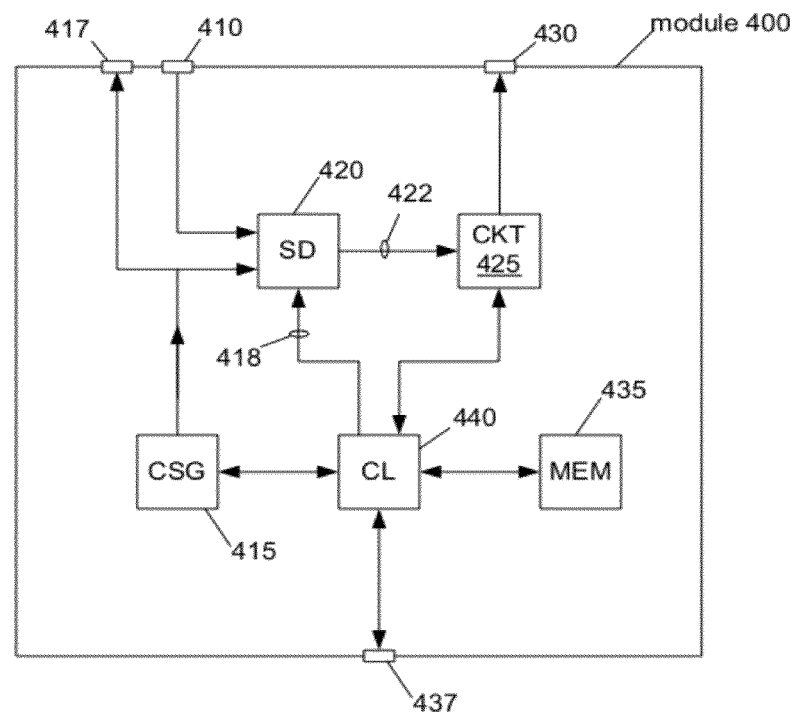
FIG. 4 illustrates one embodiment of an electronic module that is configured to support user-invoked calibration of a modular system. The illustrated electronic module is configured to serve as the first module in a series of modules.

In one set of embodiments, an electronic module 400 may be configured as shown in the conceptual diagram of FIG. 4. The module 400 may include an input port 410, a calibration signal generator 415, a switching device 420, circuitry 425, an output port 430, memory 435 and control logic 440. The module 400 is preferably constructed as a single package.

The input port 410 is configured to receive an input signal from a source external to the module 400. The input port 410 may include a connector mounted on an accessible surface of the module (e.g., the front panel of the module), and designed to mate with an end connector of a cable. Any of various types of connectors are contemplated. In one embodiment, the connector may be coax connector.

The calibration signal generator 415 is configured to generate a calibration signal so that an amplitude and frequency of the calibration signal are stable with respect to time and with respect to changes in temperature within an operating temperature range, e.g., as variously described above.

The switching device 420 may be configured to selectively pass either the input signal or the calibration signal as a selected signal to an internal signal path 422 within the electronic module 400. The switching device selectively passes either the input signal or the calibration signal based on a selection input. The switching device may be realized by any of various switch technologies.

The circuitry 425 may be configured to receive the selected signal from the internal signal path and operate on the selected signal in order to generate an output signal. (The term "internal signal path" used here is to be differentiated from the "signal transformation path" referred to above. The internal signal path extends from the output of the switch to the input of the circuitry 425.) A wide variety of embodiments are contemplated for the functionality of the circuitry 425, to serve the interests of users in any of a wide variety of fields.

The output port 430 is configured for outputting the output signal generated by the circuitry 425. An external cable may connect to the output port and convey the output signal from the electronic module 400 to another module or device (e.g., a next module in the series of FIG. 3A.)

The memory 435 (which is preferably non-volatile memory) may store measured values associated with the calibration signal, where the measured values include a measured value of the amplitude of the calibration signal, and perhaps also a measured value of the frequency of the calibration signal. The measured values have preferably been determined by measurement of the calibration signal at a facility that manufactures the module 400, e.g., as variously described above. The measured values have been stored into the memory 435 prior to delivery of the module 400 to an end user.

The module 400 preferably does not include means for performing high precision measurements of the calibration signal. Instead, the measured values of amplitude (and optionally, frequency) have preferably been determined by measurement of the calibration signal using measurement equipment external to the module, e.g., at the facility that manufactures the module.

Because the calibration signal generator is configured to generate the calibration signal so that the amplitude and frequency of the calibration signal are stable with respect to time and with respect to changes in temperature, the factory measured values of amplitude and frequency can be expected to accurately represent the operating values of the amplitude and frequency over the lifetime of the calibration signal generator (or a significant portion thereof).

The control logic 440 may be configured to access the memory 435 and to provide the measured values to a computer external to the module 400 in response to a request received from the computer. The control logic may also perform other functions, as variously described herein.

The module 400 may also include a communication port 437 configured for coupling to an external communication bus (e.g., a communication bus in the backplane of a chassis in which the module is inserted). The computer may communicate with the control logic 440 through the communication bus and the communication port 437.

The module 400 of FIG. 4 may be used to achieve the calibration method of FIG. 2A.

In some embodiments, the calibration signal generator is configured so that a nominal frequency of the calibration signal is programmable. In those embodiments, the control logic 440 may be configured to receive a frequency control instruction from the computer and to direct the calibration signal generator 415 to generate the calibration signal according to the nominal frequency.

In some embodiments, the input signal received at the input port 410 may be a modulated signal, e.g., a modulated carrier signal. Any of various types of modulation are contemplated. In one embodiment, the input signal is received from a communication channel, e.g., from the atmosphere (or free space) via an antenna, or, from a wired connection (e.g., a cabled connection). In another embodiment, the input signal is received from transmitter under test in a test frame (or test chamber).

In various embodiments, the input signal may be a tone, a superposition of tones, a modulated carrier signal, or, a superposition of modulated carrier signals over a frequency range.

In one embodiment, the module 400 may be configured to support a broad range of frequencies, e.g., any frequency in the range from near DC to multiple Gigahertz. Thus, the measured values stored in memory 435 may include a measured value of amplitude (and perhaps also a measured value of frequency) of the calibration signal for nominal frequency values extending over the whole the frequency range or over one or more portions of the frequency range.

In some embodiments, the circuitry 425 may includes frequency down-conversion circuitry (or more generally, frequency translation circuitry, which includes the capacity to up-convert as well as down-convert). Thus, the output signal of circuitry 425 may be a frequency down-converted version (or a frequency translated version) of the selected signal, i.e., the signal selected by the switching device 420.

In some embodiments, the module 400 also includes another input port configured to receive a local oscillator signal from a local oscillator source that is external to the module. (See, e.g., the system of FIG. 7.) The circuitry 425 may include a mixer and a filter. The mixer is configured to mix the selected signal with the local oscillator signal to obtain a mixed signal. The filter is configured to bandpass filter the mixed signal to obtain the output signal.

In some embodiments, the control logic 440 is further configured to control the selection control input of the switching device 420 in response to a selection control instruction received from the computer. The selection control instruction may specify which input of the switching device (the calibration signal or external input signal) is to be selected by the switching device. Thus, the computer is able to programmatically control which signal is applied to the input of circuitry 425.

In some embodiments, the module 400 may also include a calibration signal port 417. The calibration signal port 417 is coupled to receive the calibration signal from the calibration signal generator 415, and configured to output the calibration signal from the module 400. The calibration signal port preferably includes a connector mounted on an accessible surface of the module (e.g., the front panel of the module). The connector may be configured to mate with the end connector of an external cable. Thus, the module 400 may allow an external device to have access to the calibration signal. The calibration signal port may be used in the factory procedure for characterizing the calibration signal.

In some embodiments, the module 400 is configured for inserting in a chassis, e.g., along with one or more other modules as variously described above. The module and the one or more other modules may be configured for coupling in a series, e.g., via interconnecting cables, and/or, via direct mating connectors.

Figure 5A:
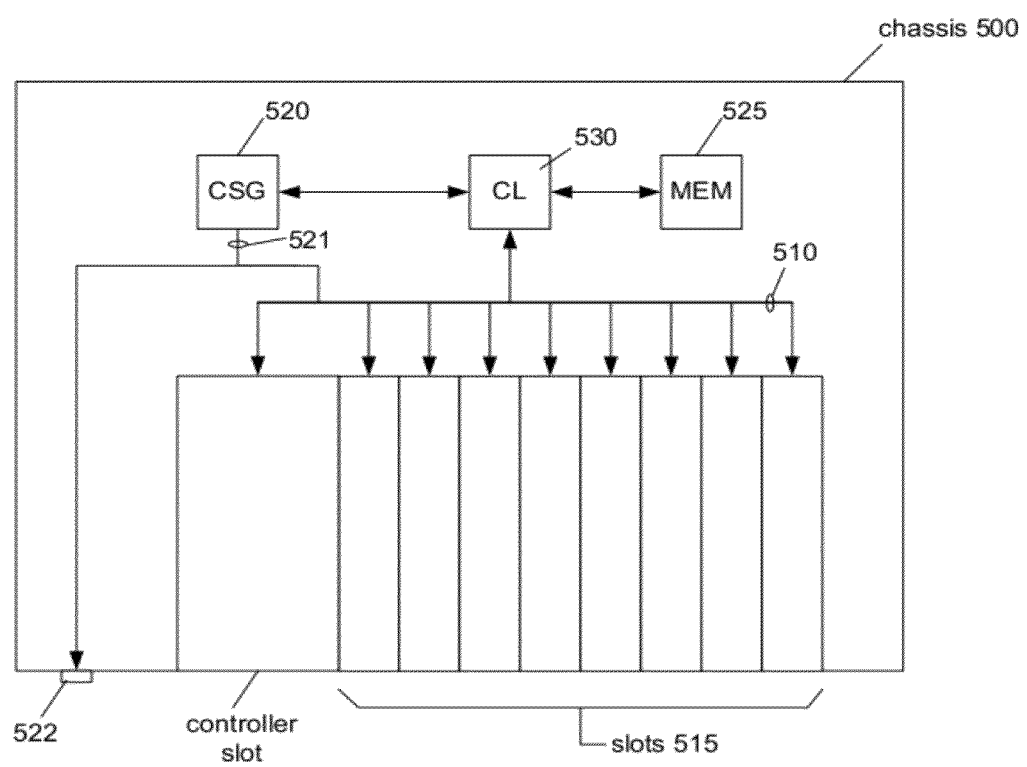
FIGS. 5A and 5B illustrate embodiments of a chassis that is configured to support user-initiated calibration of a series of modules, where the modules are configured for insertion in slots of the chassis.

In one set of embodiments, a chassis 500 for housing a plurality of electrical modules may be configured as shown in the conceptual diagram of FIG. 5A. The chassis 500 may include a bus 510, a plurality of slots (collectively referred to as slots 515), a calibration signal generator 520, memory 525 and control logic 530.

The slots 515 may be configured to admit insertion of the electrical modules, respectively. Each of the slots is configured to couple a corresponding one of the electrical modules to the bus 510 when that electrical module is inserted in the slot. Any of various slot configurations and slot dimensions are contemplated.

The calibration signal generator 520 is configured to generate a calibration signal having a stable amplitude and frequency, e.g., as variously described above. The chassis 500 may be configured so that the calibration signal is provided to each of the slots 515 (or alternatively, to a selected subset of the slots). In some embodiments, the output 521 of the calibration signal generator couples to bus 510 in order to provide the calibration signal to each slot. Thus, when a sufficiently-configured electrical module is inserted into any one of the slots, that electrical module will be able to receive the calibration signal produced by the calibration signal generator. (The plurality of electrical modules that are inserted in the slots 515 may be interconnected to form a series, e.g., by means of cable connections between their front panels. A first module of the series is configured to receive the calibration signal whenever it is inserted in a slot. This first module may be similar in design to the module 400 discussed above in connection with FIG. 4, but may possibly depart from the design of module 400 by not including its own calibration signal generator since the first module has access to the calibration signal provided by the chassis 500 when inserted in a slot of the chassis.)

Memory 525 stores measured values associated with the calibration signal, wherein the measured values include a measured value of the amplitude of the calibration signal, and perhaps also a measured value of the amplitude of the calibration signal. In some embodiments, the measured values have been determined by measuring the calibration signal at a facility that manufactures the chassis 500, e.g., as variously described above.

Control logic 530 may be configured to access the memory 525 and to provide the measured values to a computer in response to a request received from the computer, e.g., through the communication bus 510. The communication bus 510 may be realized by any of a wide variety of bus technologies or combinations thereof.

While the calibration method described above in connection with FIG. 2A relied on a first module of the module series to generate the calibration signal and to be the locus of the stored measurement values, the present invention contemplates a variation of that method, wherein the chassis 500 is used as the source of the calibration signal and the locus of the stored measurement values. Thus, in that variant method the controlling computer directs the chassis to generate the calibration signal and reads the measurement values (or any subset thereof) from the chassis.

In some embodiments, the chassis 500 may also include a timing bus. Each of the slots may be configured to couple the corresponding electrical module to the timing bus when that electrical module is inserted in the slot. The timing bus may support the timing and control of events between the modules.

In some embodiments, the chassis 500 may also supply power to each of the slots.

In some embodiments, the chassis 500 may supply cooling (or temperature control) to itself and to the modules when those modules are inserted in the slots.

In some embodiments, the chassis 500 may supply a reference clock to each of the slots.

In some embodiments, the chassis 500 may also include an output port 522 coupled to the calibration signal generator, wherein the output port has a connector that is configured to mate with an end connector of an external cable. The output port is configured to output the calibration signal to a device external to the chassis or to any module in the chassis.

In some embodiments, the control logic 530 is further configured to turn on and off the calibration signal generator in response to corresponding instructions received from the computer.

In some embodiments, the chassis 500 may also include a controller slot configured to admit insertion of the computer.

The chassis 500 preferably also includes a power supply, wherein each of the slots is coupled to the power supply and configured to provide power from the power supply to the corresponding electronic module when that electronic module is inserted in the slot.

In some embodiments, the computer may couple to the chassis through an interface kit that includes: an interface card configured for insertion in a slot of the computer; a cable; and an interface module configured for insertion in a designated slot of the chassis. (See, e.g., the MXI or MXI-Express products manufactured by National Instruments Corp.)

In some embodiments, the computer is configured for insertion in a designated slot of the chassis. Thus, the computer may communicate with the modules through the communication bus of the chassis.

In one embodiment, the chassis 500 may have physical structure and functionality similar to one of the chassis currently provided by National Instruments Corp., but additionally including a calibration signal generator and a calibration output port as variously described herein, to support user-invoked calibration as variously described herein.

Figure 5B:
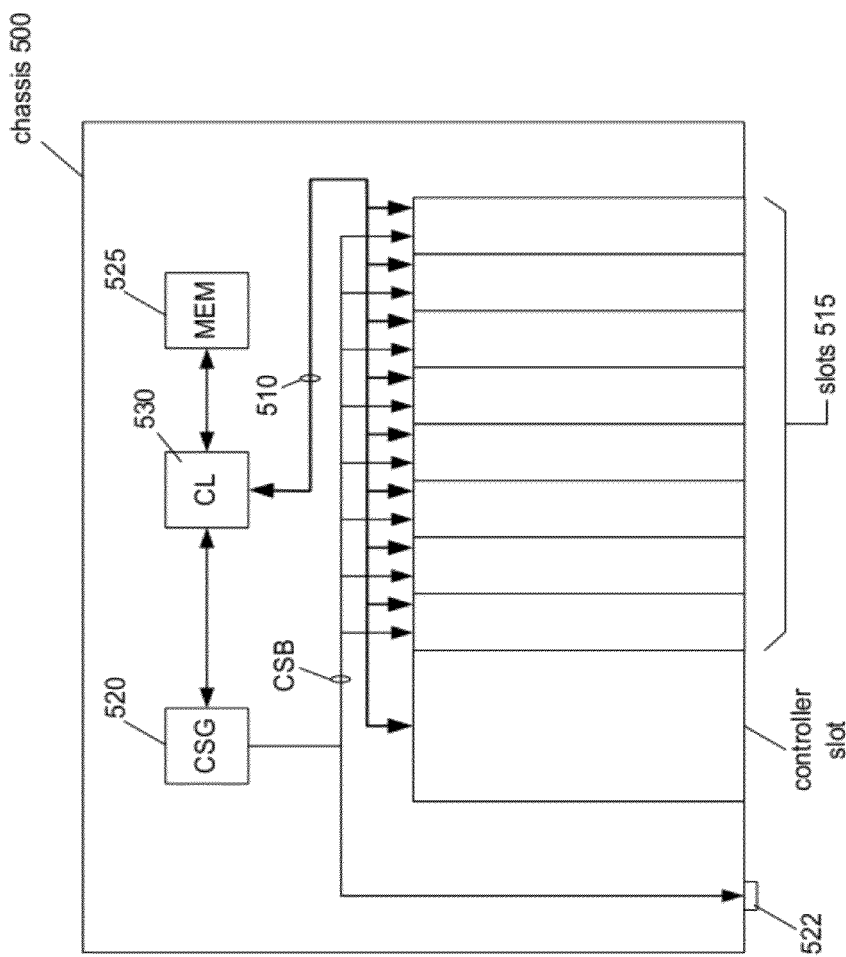

In one alternative embodiment of chassis 500, the calibration signal from the calibration signal generator 520 is supplied to each of the slots through a calibration signal bus CSB which is separate from bus 510, e.g., as shown in FIG. 5B.

Figure 6:
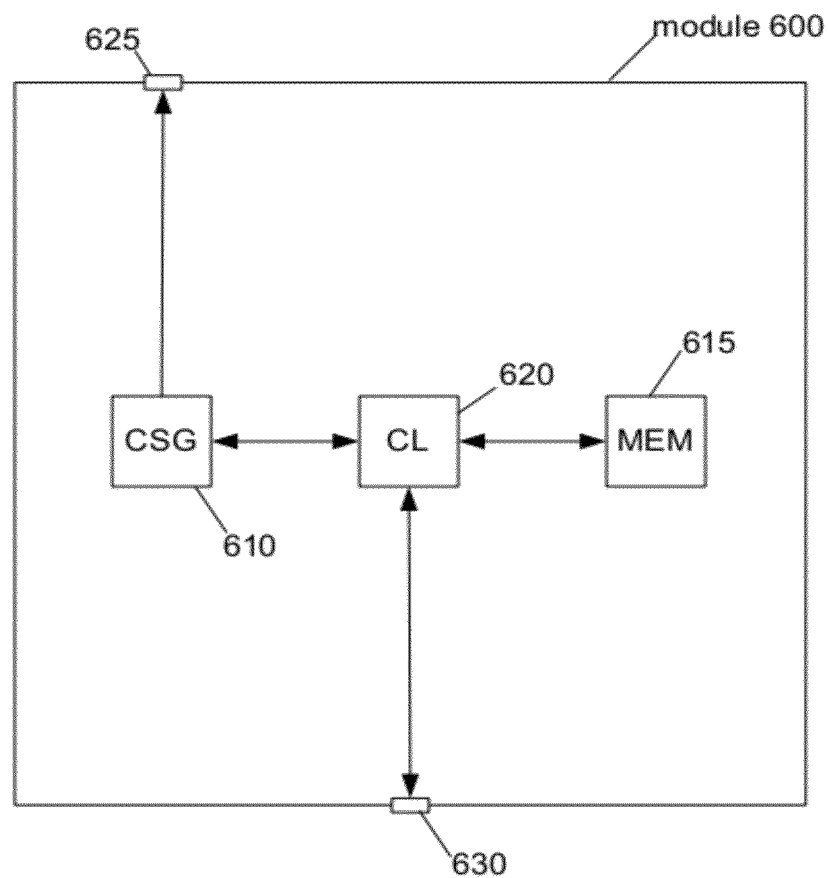
FIG. 6 illustrates one embodiment of a module that is configured to supply a calibration signal to an external module or device.

In some embodiments, an electronic module 600 may be configured as shown in the conceptual diagram of FIG. 6. The module 600 may include a calibration signal generator 610, memory 615, control logic 620 and a calibration output port 625. The module is constructed as a single package.

The calibration signal generator 610 is configured to generate a calibration signal so that an amplitude and frequency of the calibration signal are stable with respect to changes in temperature, e.g., as variously described above.

The memory 615 stores a set of one or more measured values associated with the calibration signal. The measured values include a measured value of the amplitude of the calibration signal, and perhaps also a measured value of the frequency of the calibration signal. In some embodiments, the measured values have been determined by measuring the calibration signal at a facility that manufactures the module 600, e.g., as variously described above.

The control logic 620 is configured to access the memory 615 and to provide the measured values to a computer external to the module 600 in response to a request received from the computer. The control logic 620 may couple to a communication port 630 for interfacing with the communication bus of the chassis. In some embodiments, the control logic 620 may be realized in any of various forms, e.g., as a program that executes on a processor within the module 600, as custom-designed digital circuitry, as a programmable hardware element that has been appropriately programmed with configuration information, etc.

The calibration output port 625 is coupled to the calibration signal generator and configured to output the calibration signal from the module 600. Thus, another module or device external to the module 600 may have access to the calibration signal by coupling to the calibration output port, e.g., via a wired connection (such as a cable connection).

In some embodiments, the module 600 is configured for insertion in at least one slot of a plurality of slots of a chassis. In some embodiments, the chassis is a chassis conforming the PXI standard or the PXIe standard. (Such chassis are available from National Instruments Corp.)

In some embodiments, the calibration output port 625 may include a connector mounted on a front plate (or face or panel) of the module 600 so the connector is accessible to a user even while the module is inserted in a slot of a chassis. The connector may be configured to mate with the end connector of a cable. Thus, the user may connect a cable to the calibration output port in order to supply the calibration signal to another module or device (e.g., another module that is inserted in another slot of the same chassis).

Alternatively, the calibration output port may 625 may include a connector that is configured to couple with a complementary connector that is part of a backplane of the chassis when the module 600 is inserted in a slot (e.g., a specially-configured slot) of the chassis. (This connector may be mounted on a back face or edge of the module 600.) Thus, the calibration signal may be provided to one or more other modules through the backplane of the chassis.

In some embodiments, the module 600 includes two calibration output ports, one on the front plate of the module and another on the back plate (or edge).

In some embodiments, the module 600 is configured to receive power from the chassis when inserted into the slot of the chassis.

In some embodiments, the module 600 is a PXI module or PXI Express module; and the chassis is a PXI or PXI Express chassis.

In some embodiments, the module 600 has a user access panel. The calibration output port 625 may have a connector that is mounted on the user access panel. The calibration output port is configured to make the calibration signal externally available via the connector.

Module 600 may be used to determine the gain of a signal transformation path that extends through an interconnected series of one or more others modules. The first module of the series may have a calibration input port for receiving the calibration signal. (For example, imagine a modification of the module $K_1$ of FIG. 3B, where a calibration input port is added, where the calibration signal generator 315 is removed, and where the calibration signal input to the switch 320 is supplied by the calibration input port.) The user may couple the calibration output port of module 600 to the calibration input port of the first module so that the calibration signal will be conveyed from module 600 to first module. The gain of the signal transformation path may be determined as shown in FIG. 2A. However, instead of reading the set of one or more measurements values (associated with the calibration signal) from the first module of the series, the computer reads those values from the module 600.

In some embodiments, an automated procedure for factory characterization of the calibration signal may include: a computer-controlled robot grasping a circuit board from an assembly line; the robot connecting the circuit board to a power source and to a computer bus; a vision system locating the output node of the calibration signal generator on the circuit board (e.g., using a computer vision algorithm); the robot applying a probe of a measurement device to the output node; a control computer reading the measured amplitude and frequency of the calibration signal from the measurement device; and the control computer transferring the measured values to the memory of the circuit board (e.g., via the computer bus).

In another embodiment, the automated procedure may operate on a module in its assembled state, i.e., where the circuit board has already been incorporated into a final package so far as the addition of physical elements is concerned. Thus, instead of grasping a circuit board from the assembly line, the robot grasps a module. The robot may couple the measurement probe to a calibration signal port of the module. The calibration signal port may be configured for outputting the calibration signal from the module.

Figure 7:
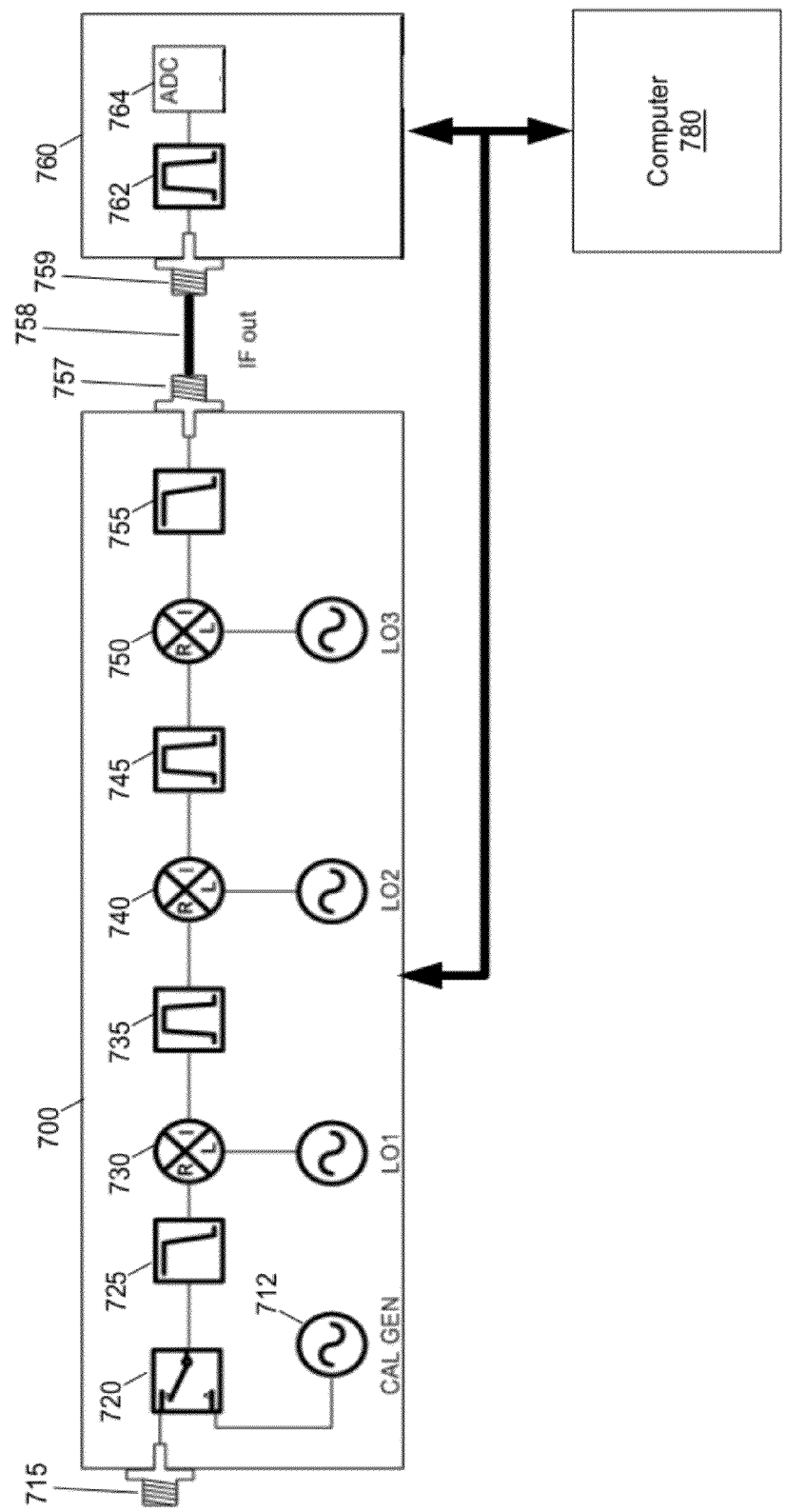
FIG. 7 illustrates one embodiment of a modular instrument that includes a frequency translation module and digitization module coupled in a series.

FIG. 7 is a block diagram illustrating a pair of modules (i.e., modules 700 and 760) that are coupled together to form a modular instrument. Module 700 is a frequency translation module (e.g., a frequency down-conversion module). Module 760 is an IF digitization module. Both modules may be configured for insertion into corresponding slots of a chassis.

An input signal supplied at input port 715 is supplied to a first input of switch 720. The second input of switch 720 is provided with the calibration signal produced by calibration signal generator 712. (The calibration signal generator 712 is located within the module 700.) The selection state of the switch is controlled by computer 780. The signal selected by the switch is supplied to a lowpass filter 725. The output signal from the lowpass filter is mixed with a first local oscillator signal LO1 in mixer 730. The mixed signal produced by the mixer 730 is supplied to a bandpass filter 735. The output signal of the bandpass filter 735 is mixed with a second local oscillator signal LO2 in mixer 740. The mixed signal produced by mixer 740 is supplied to bandpass filter 745. The filtered signal produced by bandpass filter 745 is mixed with a third local oscillator signal LO3 in mixer 750. The mixed signal produced by mixer 750 is provided to a lowpass filter 755. The signal v(t) produced by lowpass filter 755 is provided as output to output port 757. (The signal v(t) is a frequency translated version, e.g., a frequency down-converted version, of the signal selected by the switch 725.) The signal v(t) is conveyed by means of a cable 758 (e.g., a user-supplied cable) to the input port 759 of module 760.

A bandpass filter 762 in module 760 operates on the signal v(t) to produce a filtered signal. The filtered signal is digitized by analog-to-digital converter 764, thereby producing a sequence of samples. The samples may be provided to (or made available to) the computer 780.

In addition to the elements shown, module 760 may include: an on-board processor that is configured to execute program instructions stored in an on-board memory; and/or a programmable hardware element (such as an FPGA).

In one embodiment, the local oscillator signals LO1, LO2 and LO3 may be provided as inputs to the module 700 by a third module (not shown). The local oscillator signals may have different frequencies that are independently programmable, e.g., frequencies that are determined by the computer 780.

While FIG. 7 shows module 700 as being a three-stage frequency translation module (i.e., three stages of frequency translation, each stage including a corresponding mixer and a corresponding filter), other numbers of stages are contemplated, e.g., one stage, two stages, or more than three stages.

In one embodiment, the first stage of module 700 is an up-conversion stage, while the last two stages are down-conversion stages.

In one embodiment, both modules 700 and 760 are configured as PXI Express modules (or PXI modules). In this embodiment, ports 715 and 757 may be located on the front panel of the module 700, and port 759 may be located on the front panel of module 760.

Module 700 may be configured as variously described above, e.g., as described above in connection with module $K_1$ of FIG. 3B, or in connection with module 400 of FIG. 4. Module 700 may be configured to support user-initiated calibration, e.g., as described above in connection with FIG. 2A.

As explained in detail above, a computer (such as computer 780) may obtain a characterization of the gain of the signal transformation path over a frequency range by repeatedly re-tuning the calibration signal generator (e.g., generator 712) to different frequencies (that cover the frequency range), and performing operations 215 through 230 of FIG. 2A at each of the frequencies.

Figure 8A:
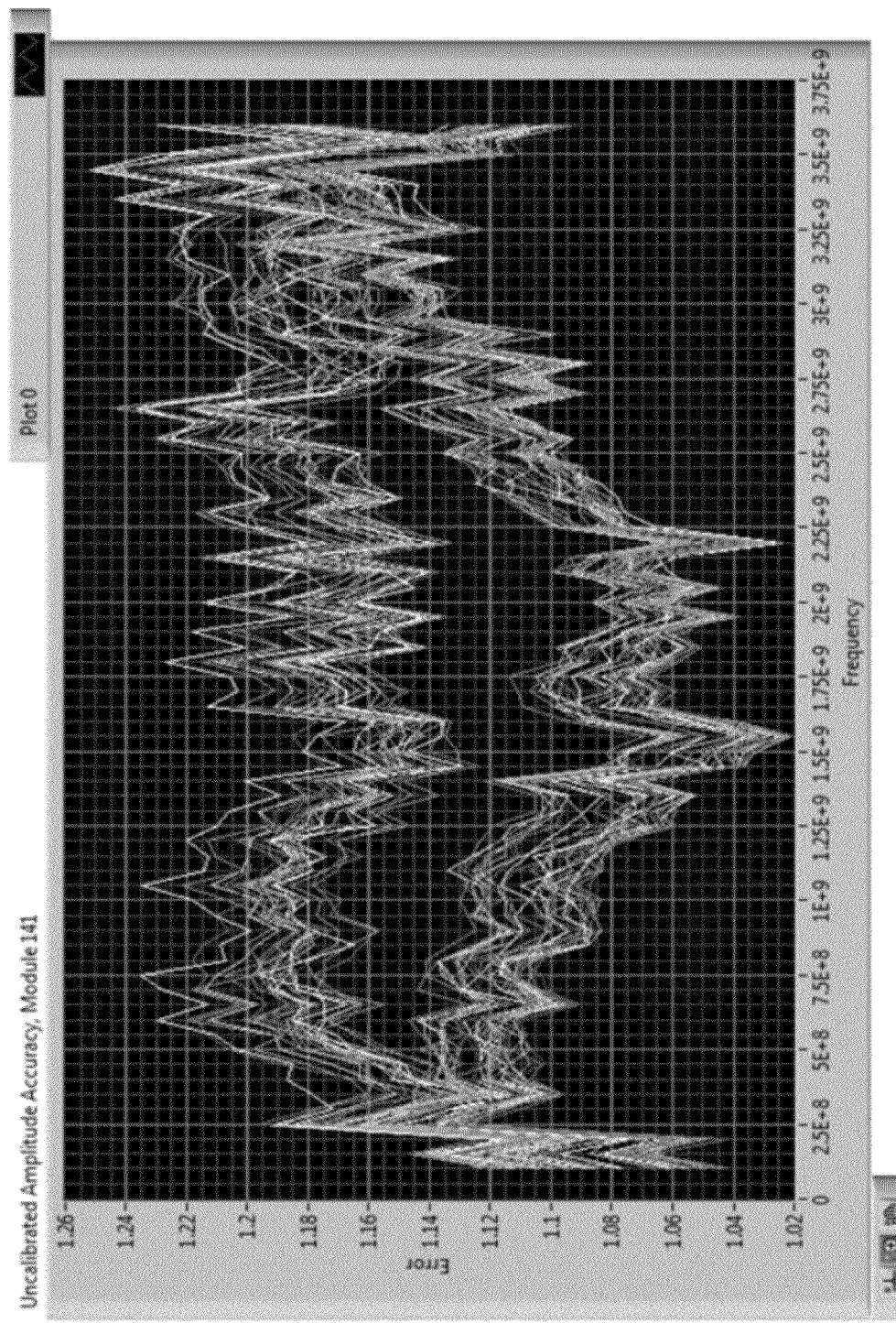
FIGS. 8A and 8B provide amplitude accuracy data for a system without calibration and with calibration, respectively.

FIG. 8A illustrates uncalibrated amplitude accuracy for one embodiment of the modular instrument of FIG. 7 over a frequency range that extends from approximately 100 MHz to over 3.5 GHz.

Figure 8B:
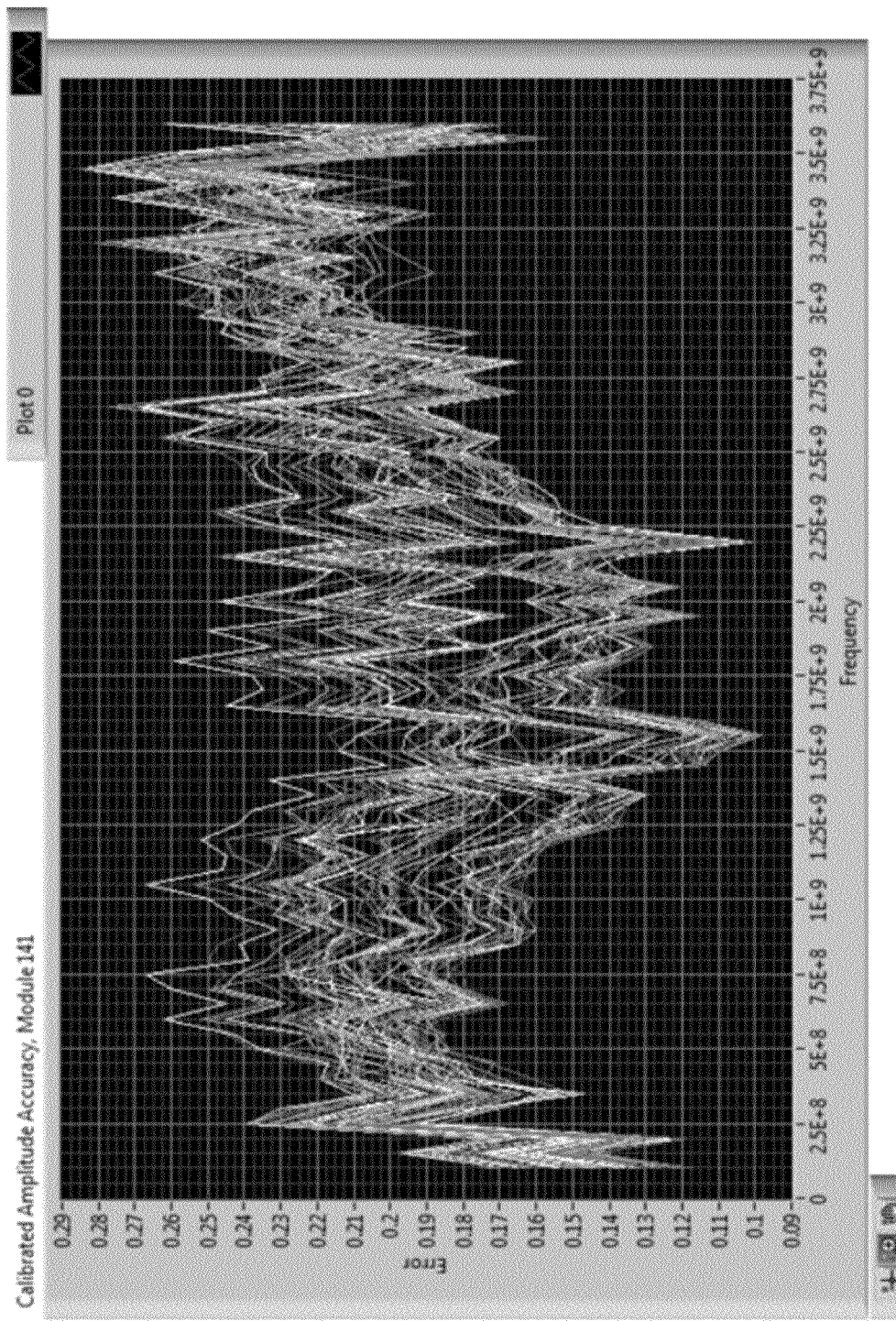

FIG. 8B illustrates calibrated amplitude accuracy for the same modular instrument over the same frequency range. Observe the significant decrease in error as compared to the uncalibrated amplitude data.

Figure 9:
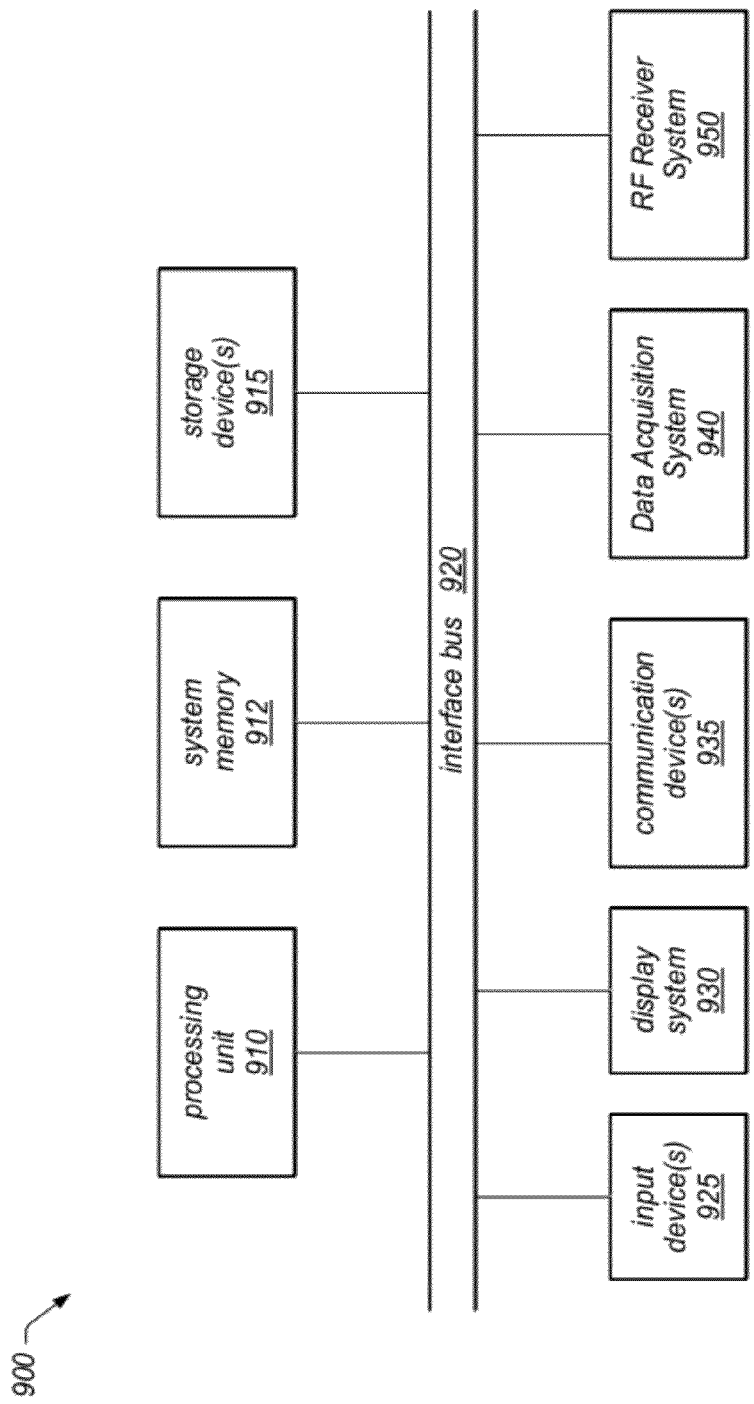
FIG. 9 illustrates one embodiment of a computer system 900 that may be used to perform or control any of the method embodiments described herein.

FIG. 9 illustrates one embodiment of a computer system 900 that may be used to perform any of the method embodiments described herein, or, any combination of the method embodiments described herein, or any subset of any of the method embodiments described herein, or, any combination of such subsets. For example, computer system 900 may be used to perform the method of FIG. 2A.

Computer system 900 may include a processing unit 910, system memory 912, a set 915 of one or more storage devices, an interface bus 920, a set 925 of input devices, and a display system 930.

System memory 912 may include a set of semiconductor devices such as RAM devices (and perhaps also a set of ROM devices).

Storage devices 915 may include any of various storage devices such as one or more memory media and/or memory access devices. For example, storage devices 915 may include one or more devices such as any subset of the following: a CD/DVD-ROM drive, a hard disk, a magnetic disk drive, magnetic tape drives, flash memory, etc.

Processing unit 910 is configured to read and execute program instructions, e.g., program instructions stored in system memory 912 and/or on one or more of the storage devices 915. Processing unit 910 may couple to system memory 912 through interface bus 920 (or through a system of interconnected busses). The program instructions configure the computer system 900 to implement a method, e.g., any of the method embodiments described herein, or, any combination of the method embodiments described herein, or, any subset of any of the method embodiments described herein, or any combination of such subsets.

Processing unit 910 may include one or more processors (e.g., microprocessors).

One or more users may supply input to the computer system 900 through the input devices 925. Input devices 925 may include devices such as a keyboard, a mouse, a touch-sensitive pad, a touch-sensitive screen, a graphics tablet, a track ball, a light pen, a data glove, eye orientation and/or head orientation sensors, a microphone (or set of microphones), or any combination thereof.

The display system 930 may include any of a wide variety of display devices representing any of a wide variety of display technologies. For example, the display system may be a computer monitor, a head-mounted display, a projector system, a volumetric display, or a combination thereof. In some embodiments, the display system may include a plurality of display devices. In one embodiment, the display system may include a printer and/or a plotter.

In some embodiments, the computer system 900 may include one or more other devices, e.g., devices such as one or more graphics accelerators, one or more speakers, a sound card, a video camera, a video card, etc.

In some embodiments, computer system 900 may include one or more communication devices 935, e.g., a network interface card for interfacing with a computer network, or, a peripheral interface card for interfacing with peripheral devices.

In some embodiments, the communication devices may include a board or card for communicating with a chassis as variously described herein.

In some embodiments, one or more of the various modules described herein may include one or more programmable hardware elements (PHEs). The PHEs are programmable to achieve a user-desired configuration of processing operations, e.g., via a program written using LabVIEW FPGA.

The computer system may be configured with a software infrastructure including an operating system, and perhaps also, one or more graphics APIs (such as OpenGL®, Direct3D, Java 3D™). In some embodiments, the software infrastructure may include LabVIEW and/or LabVIEW FPGA, which are software products of National Instruments Corporation. The software infrastructure may also include a set of drivers for interacting with the chassis as variously described herein, and/or, with any subset (e.g., with each and every one) of the various modules described herein.

Figure 10:
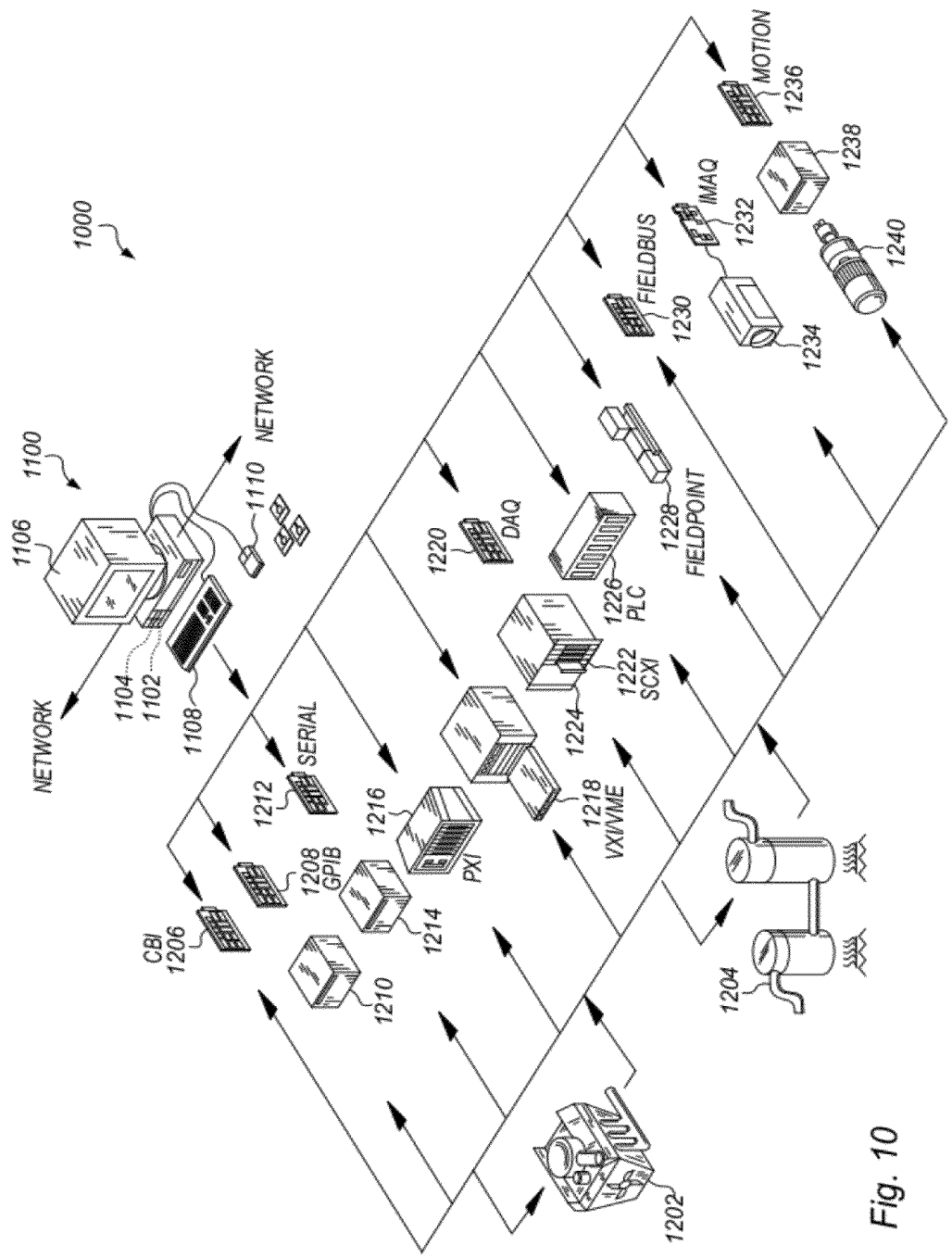
FIG. 10 illustrates one set of embodiments of a system 1000 for performing any of various test and/or measurement and/or control functions.

In some embodiments, the above-described techniques may be implemented within the context of a test and measurement/control system. FIG. 10 is a diagram that illustrates a collection of possible embodiments of a test and measurement/control system 1000. One or more portions of the system 1000 may be used to implement one or more embodiments of the present invention. System 1000 may include various combinations of hardware and software that may be used to implement various measurement and/or control processes.

System 1000 may include a host computer 1100. Host computer 1100 is configured to execute computer programs/routines that provide various computer-related functions, such as functions for implementing or controlling the calibration of a modular instrument (or an interconnected series of modules) as variously described herein. Moreover, the block diagram of FIG. 3A or the block diagram of FIG. 7 may be implemented using a chassis and one or more modules provided within system 1000.

Host computer 1100 may include various components such as central processing unit (CPU) 1102 and a memory medium 1104. Memory medium 1104 may include a tangible non-transitory computer-readable storage medium, such as random access memory (RAM), flash memory, hard-drives, and/or CD-ROMs, or the like. Memory medium 1104 may have program instructions stored thereon that are executable (e.g., by CPU 1102) to implement one or more methods, such as methods for calibration as described herein. In the illustrated embodiment, host computer 1100 includes a display device (e.g., a monitor) 1106, an alphanumeric input device (e.g., a keyboard) 1108, and a directional input device (e.g., a mouse or trackpad) 1110.

In some embodiments, host computer 1100 may include modular and/or plug-in boards/cards (e.g., with either commercially available or proprietary hardware) that may be added via a number of expansion slots internal or external to the computer body. For example, host computer 1100 may include PCI/PCI Express slots and/or PCI/PCI Express cards disposed therein. As described in more detail below, host computer 1100 may be connected to one or more devices, such as an expansion chassis for connecting to a various number and combination of devices. In certain embodiments, host computer 1100 and/or other portions of system 1000 may be connected to one or more other devices via a network, such as an internal network (e.g., a local area network (LAN)) and/or an external network (e.g., the Internet). In certain embodiments, host computer 1100 may be used for various input/output (I/O) functions and processing tasks. For example, host computer 1100 may be used for data acquisition (DAQ) (e.g., when a DAQ digitizing board is installed in computer 1100 or a device coupled thereto, such as a chassis, and associated software is executed).

Host computer 1100 may be configured to connect/communicate with other instruments/devices of system 1000. In some embodiments, host computer 1100 may operate with one or more devices of system 1000 to generate and provide data, to acquire data, to analyze data. For example, computer 1100 may communicatively couple to and control apparatus 1202, processes 1204, or the like.

In some embodiments, host computer 1100 may operate with the one or more devices in communication with apparatus 1202 or process 1204 to perform an automation function, such as MMI (Man Machine Interface), SCADA (Supervisory Control and Data Acquisition), portable or distributed data acquisition, process control, advanced analysis, or other data acquisition and control functions. For example, system 1000 may be used to implement data acquisition and control applications, test and measurement applications, image acquisition and processing applications, machine vision processing applications, process control applications, man-machine interface applications, simulation applications, hardware-in-the-loop validation applications, motion control applications, computer-based instruments (CBI) applications, signal conditioning (SCXI) applications, or the like. One or more of the instruments/devices of system 1000 may include: a programmable hardware element (such as an FPGA); and/or a processor configured to execute program instructions stored in a memory.

System 1000 may include a variety of devices. For example, system 1000 may include modular instrumentation devices, such as test and measurement devices manufactured by National Instruments Corporation. In some embodiments, system 1000 may include computer-based instrumentation (CBI) 1206 such as a digital multi-meter (DMM), an oscilloscope (SCOPE), a radio-frequency (RF) device (e.g., an up-converter or down-converter), an arbitrary waveform generator (ARB), or the like. System 1000 may include general purpose interface bus (GPIB) device 1208, such as a modular GPIB card used to communicate with a GPIB device 1210 (e.g., an oscilloscope) via a GPIB communication protocol. System 1000 may include a serial device 1212, such as a modular serial card used to communicate with a serial device 1214 (e.g., an oscilloscope) via a serial communication protocol. System 1000 may include a (PXI) device 1216, such as a PXI chassis having modules of PXI form factor installed therein. System 1000 may also include a PXI Express device (not shown) such as a PXI Express chassis having modules of PXI Express form factor installed therein.

System 1000 may include a (VXI/VME) device 1218, such as a VXI/VME chassis having VXI/VME form factor modular devices (e.g., VXI/VME controllers/modules) installed therein. System 1000 may include data acquisition (DAQ) device 1220, such as modular instrumentation including data input/output (I/O) interfaces for receiving, transmitting, conditioning, and/or processing signals (e.g., digital and analog signals). System 1000 may include signal conditioning (SCXI) devices 1222 that can be used to condition and/or route signals, such as I/O signals such as those transmitted/received at DAQ device 1220. SCXI device 1222 may include a chassis 1224 having devices 1222 installed therein (e.g., a relay/switch module having a relay/switch matrix). System 1000 may include a programmable logic controller (PLC) 1226, such as a PLC used for the automation of electromechanical process. System 1000 may include a distributed I/O module, such as a FieldPoint module 1228. System 1000 may include a distributed control module, such as a Fieldbus module 1230. System 1000 may include an image acquisition (IMAQ) system, such as a modular IMAQ module 1232 and an associated IMAQ device (e.g., camera) 1234. System 1000 may include a motion control system, such as a modular motion controller device 1236, a motor drive 1238, and a motor 1240. System 1000 may include any variety of other devices.

Although some of the devices of system 1000 are illustrated in association with a chassis (e.g., modules) and some are illustrated independent from a chassis (e.g., card or standalone devices), some embodiments of system 1000 may include all or some of the described devices being provided in a module form factor to be inserted in a chassis and/or in a card form factor to be installed in computer 1100. For example, PXI device 1216 may include a PXI chassis housing any combination of modular CBI devices, GPIB devices, serial devices, SCXI devices, DAQ devices, IMAQ devices, motion devices, or the like.

Although various embodiments have been described above in considerable detail, numerous variations and modifications will become apparent to those skilled in the art once the above disclosure is fully appreciated. It is intended that the following claims be interpreted to embrace all such variations and modifications. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. The words "include", "including", and "includes" mean including, but not limited to. As used herein, the singular forms "a", "an" and "the" include plural referents unless the content clearly indicates otherwise. Thus, for example, reference to "a device" may include a combination of two or more devices.

We claim:

1. A method for operating a computer in order to calibrate a signal transformation path that extends through a series of two or more interconnected modules, wherein an input to the signal transformation path resides in a first module of the series, wherein an output of the signal transformation path resides in a last module of the series, the method comprising:
   (a) a computer sending a first instruction to the first module, wherein the instruction directs the first module to couple a calibration signal produced by a calibration signal generator to the input of the signal transformation path, wherein the calibration signal generator is located within the first module;
   (b) the computer reading measurement values from a memory of the first module, wherein the measurement values include a measured value of the amplitude of the calibration signal and a measured value of the frequency of the calibration signal;
   (c) the computer reading output power measurements from a power measuring device, wherein the output power measurements are measurements of power of an output signal produced at the output of the signal transformation path in response to said calibration signal being coupled to the input of the signal transformation path;
   (d) the computer calculating a gain between the input and the output of the signal transformation path based on the measured value of the amplitude of the calibration signal and based on the output power measurements; and
   (e) the computer storing the gain in a memory of the computer.

2. The method of claim 1, wherein the measurement values have been determined by measurements of the calibration signal performed at a facility that manufactures the first module.

3. The method of claim 1, wherein the computer performs (a), (b), (c), (d) and (e) in response to receiving a user command through a graphical user interface.

4. The method of claim 1 further comprising:
   the computer sending a second instruction to the first module, wherein the second instruction directs the first module to couple an external signal to the input of the signal transformation path, wherein the external signal is from a source external to the first module;
   the computer reading additional output power measurements from the power measuring device, wherein the additional output power measurements are measurements of power of the output signal produced at the output of the signal transformation path in response to said coupling of the external signal to the input of the signal transformation path; and
   the computer calculating a power of the external signal based on the gain stored in the memory of the computer and based on the additional output power measurements read from the power measuring device.

5. The method of claim 1, wherein the memory of the first module also stores a set of factory-measured gain values corresponding to a set of frequencies that span a frequency range, wherein each of the factory-measured gain values is a gain of the signal transformation path at the corresponding frequency, wherein the frequency of the calibration signal is within the frequency range, wherein the method further comprises:
   the computer computing a gain value $G^*$ corresponding to the frequency of the calibration signal based on the factory-measured gain values;
   the computer applying a translation to the set of factory-measured gain values based on a difference between the gain computed in (d) and the gain value $G^*$;
   the computer storing the translated set of gain values in the memory of the first module.

6. The method of claim 1, wherein the calibration signal generator is configured so that a nominal frequency of the calibration signal is programmable, the method further comprising:
   the computer determining values $G(f_k)$ of the gain corresponding respectively to distinct values $f_k$ of the nominal frequency by repeatedly programming the nominal frequency of the calibration signal to each of the distinct values and performing (b) through (e) for each of the distinct values.

7. The method of claim 6, further comprising:
   the computer interpolating a value of gain corresponding to a center frequency of a received signal based on the stored values of gain corresponding to two or more of the distinct values of nominal frequency;
   the computer instructing the first module to decouple the calibration signal from the input of the signal transformation path and couple the received signal to the input of the signal transformation path;

the computer reading additional output power measurements from the power measuring device, wherein the additional output power measurements are measurements of power of the output signal produced at the output of the signal transformation path in response to the received signal being coupled to the input of the signal transformation path;

the computer adjusting the additional output power measurements using the interpolated gain value in order to obtain corrected power values for the received signal.

8. The method of claim 6, wherein the distinct values of the nominal frequency cover a bandwidth of a received signal, the method further comprising:

the computer computing an equalization filter based on the stored values of the gain corresponding to the distinct values of the nominal frequency, wherein the equalization filter is configured to compensate for the gain of the signal transformation path over the bandwidth of the received signal;

the computer instructing the first module to couple the received signal to the input of the signal transformation path and decouple the calibration signal from the input of the signal transformation path.

9. The method of claim 8, further comprising:

the computer sending the equalization filter to the last module, wherein the last module is configured to apply the equalization filter to the output signal produced at the output of the signal transformation path in response to said coupling the received signal to the input of the signal transformation path.

10. The method of claim 6, wherein the memory of the first module also stores a set of factory-measured gain values corresponding to a set of frequencies that span a frequency range, wherein each of the factory-measured gain values is a gain of the signal transformation path at the corresponding frequency of said set, wherein the distinct values $f_k$ of the nominal frequency occur within the frequency range, wherein the method further comprises:

the computer deriving gain values $g_k$ corresponding to the distinct values of the nominal frequency based on the factory-measured gain values;

the computer adjusting the set of factory-measured gain values based on differences between the gain values $G(f_k)$ and the corresponding gain values $g_k$;

the computer stored the adjusted set of gain values in the memory of the first module.

11. The method of claim 1, wherein the signal transformation path includes:

a frequency down-conversion system configured to down-convert an input signal present at the input of the signal transformation path in order to obtain an intermediate frequency (IF) signal; and a digitizer system configured to capture samples of the IF signal.

12. A system comprising:

a plurality of modules, wherein each of the modules includes a corresponding signal-modifying subsystem, wherein the modules are interconnected so that the corresponding signal-modifying subsystems form a series;

wherein a first of the modules of the series also includes:

an input port for receiving an input signal;

a calibration signal generator configured to generate a calibration signal having a stable frequency and amplitude;

a switching device configured to selectively supply either the input signal or the calibration signal as a selected signal to an input of the signal-modifying subsystem in the first module, wherein the switching device selectively passes either the input signal or the calibration signal based on a selection input;

memory that stores measured values associated with the calibration signal, wherein the measured values include a measured value of the frequency of the calibration signal and a measured value of the amplitude of the calibration signal;

control logic configured to access the memory and to make the measured values available to a computer external to the system in response to a request received from the computer;

wherein each of the modules is a separate package.

13. The system of claim 12, wherein the calibration signal generator is configured to generate the calibration signal so that the frequency and the amplitude of the calibration signal are stable with respect to time and with respect to changes in temperature.

14. The system of claim 12, wherein the measured values have been determined by measuring the calibration signal at a facility that manufactures the first module, and have been stored into the memory of the first module at that facility.

15. The system of claim 12, wherein the modules are configured for insertion in a chassis having a plurality of slots, wherein each module is configured for insertion in one of the slots of the chassis.

16. The system of claim 15, wherein each of the modules is configured to communicate with the computer via a backplane of the chassis.

17. The system of claim 12, wherein the modules are interconnected via one or more electrical cables.

18. The system of claim 12, wherein the signal-modifying subsystem of the last module includes an analog-to-digital converter, wherein the output signal produced by that signal-modifying subsystem is a stream of samples.

19. The system of claim 12, wherein the signal-modifying subsystem of the first module includes a frequency-down conversion circuit, wherein the signal-modifying subsystem of a last of the modules includes an analog-to-digital converter.

20. The system of claim 12, wherein a last of the modules includes control logic and a power measuring device, wherein the power measuring device is configured to make measurements of power of an output signal produced by the signal-modifying subsystem of the last module, wherein the power measuring device is configured to store the power measurements in a memory of the last module, wherein the control logic of the last module is configured to transfer the stored power measurements to the computer in response to a read request asserted by the computer.

21. The system of claim 12, wherein a last of the modules includes an output port configured to make an output signal produced by the signal-modifying subsystem of the last module available to a device external to the last module.

* * * * *